(12) United States Patent
Zeng et al.

(10) Patent No.: US 8,076,719 B2
(45) Date of Patent: Dec. 13, 2011

(54) SEMICONDUCTOR DEVICE STRUCTURES AND RELATED PROCESSES

(75) Inventors: Jun Zeng, Torrance, CA (US);
Mohamed N. Darwish, Campbell, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 12/368,399

(22) Filed: Feb. 10, 2009

(65) Prior Publication Data
US 2009/0206924 A1 Aug. 20, 2009

Related U.S. Application Data

(60) Provisional application No. 61/065,759, filed on Feb. 14, 2008.

(51) Int. Cl.
*H01L 29/78* (2006.01)
(52) U.S. Cl. .. 257/330; 257/334; 257/341; 257/E29.257
(58) Field of Classification Search ................ 257/330, 257/334, 341, E29.257
See application file for complete search history.

(56) References Cited

U.S. PATENT DOCUMENTS

| | | | |
|---|---|---|---|
| 5,168,331 A | 12/1992 | Yilmaz | |
| 5,282,018 A | 1/1994 | Hiraki et al. | |
| 5,525,821 A | 6/1996 | Harada | |
| 5,637,898 A | 6/1997 | Baliga | |
| 5,864,159 A | 1/1999 | Takahashi | |
| 5,973,359 A | 10/1999 | Kobayashi | |
| 5,998,833 A | 12/1999 | Baliga | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,468,878 B1 * | 10/2002 | Petruzzello et al. | 438/454 |
| 6,525,373 B1 | 2/2003 | Kim | |
| 6,534,828 B1 | 3/2003 | Kocon | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 2001/0001494 A1 | 5/2001 | Kocon | |

(Continued)

FOREIGN PATENT DOCUMENTS
WO 97/33320 A1 9/1997
(Continued)

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.

(Continued)

*Primary Examiner* — Long Pham
(74) *Attorney, Agent, or Firm* — Robert Groover

(57) ABSTRACT

Improved highly reliable power RFP structures and fabrication and operation processes. The structure includes plurality of localized dopant concentrated zones beneath the trenches of RFPs, either floating or extending and merging with the body layer of the MOSFET or connecting with the source layer through a region of vertical doped region. This local dopant zone decreases the minority carrier injection efficiency of the body diode of the device and alters the electric field distribution during the body diode reverse recovery.

6 Claims, 27 Drawing Sheets

U.S. PATENT DOCUMENTS

| | | | |
|---|---|---|---|
| 2001/0041407 | A1 | 11/2001 | Brown |
| 2003/0203576 | A1 | 10/2003 | Kitada et al. |
| 2006/0060916 | A1 | 3/2006 | Girdhar et al. |
| 2007/0004116 | A1 | 1/2007 | Hshieh |
| 2007/0013000 | A1 | 1/2007 | Shiraishi |
| 2008/0099837 | A1* | 5/2008 | Akiyama et al. ............ 257/341 |
| 2010/0084706 | A1* | 4/2010 | Kocon ........................ 257/330 |

FOREIGN PATENT DOCUMENTS

| | | |
|---|---|---|
| WO | 2006027739 | 3/2006 |

OTHER PUBLICATIONS

J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.

J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.

* cited by examiner

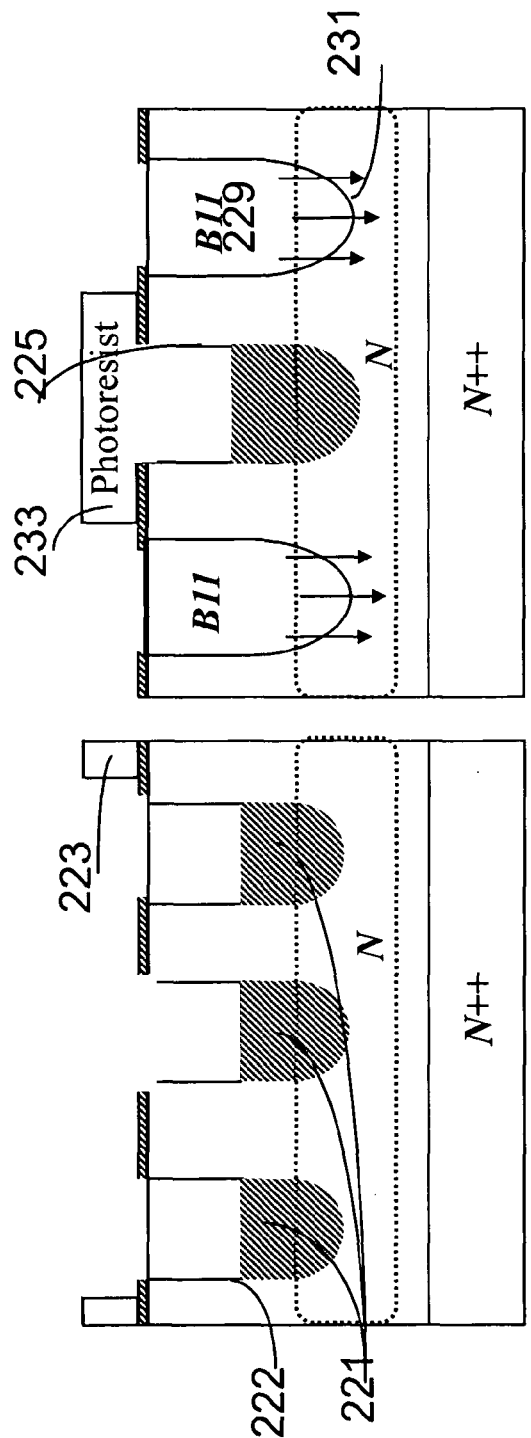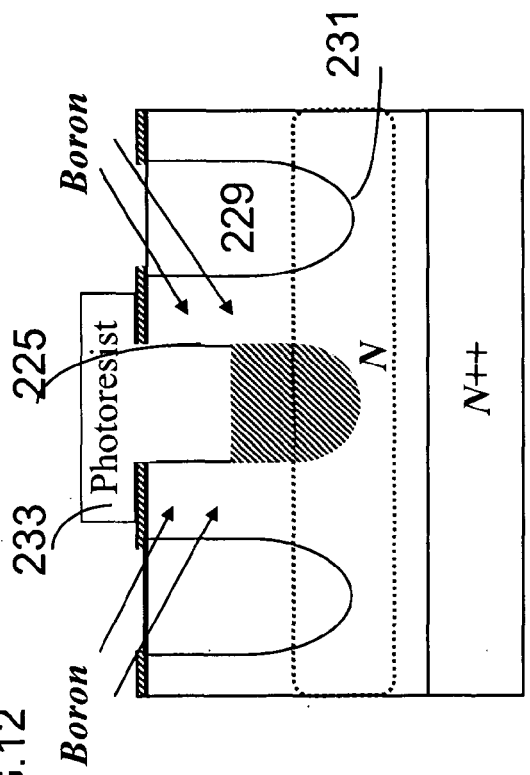
FIG.12
FIG.13
FIG.13+ (optional)

SEMICONDUCTOR DEVICE STRUCTURES AND RELATED PROCESSES

CROSS REFERENCE TO RELATED APPLICATIONS

This application claims priority to U.S. Provisional Application Ser. No. 61/065,759 filed Feb. 14, 2008, which is incorporated by reference herein in its entirety.

BACKGROUND

The present invention relates to field effect transistors and methods, and more particularly to highly reliable power insulated-gate field effect transistors (MOSFET) with a Recessed Field Plate (RFP) and related techniques.

BRIEF DESCRIPTION OF THE DRAWINGS

FIG. 4(*b*) is a cross-sectional view of an RFP containing MOSFET structure with a Deep compensated zone that extends to and is connected to the source electrode.

FIG. 4(*c*) is a cross-sectional view of an RFP containing MOSFET structure with a Deep compensated zone that extends to the P body region.

FIGS. 6-18 show successive steps in a sample process for making the sample structure depicted in FIG. 4(*a*).

DETAILED DESCRIPTION OF SAMPLE EMBODIMENTS

Power MOSFETs are widely used as switching devices in many electronic applications. In order to minimize conduction power loss, it is desirable that MOSFETs have low specific on-resistance, which is defined as the on-resistance area product ($R_{on}*A$), where $R_{on}$ is a MOSFET resistance when the MOSFET is in an ON state, where A is the area of the MOSFET. Trench MOSFETs provide low specific on-resistance, particularly in the 10-100 voltage range. As cell density increases, any associated capacitances such as a gate-to-source capacitance Cgs, a gate-to-drain capacitance Cgd and/or a drain-to-source capacitance Cds also increase. In many switching applications such as synchronous buck dc-dc converters in mobile products, MOSFETs with breakdown voltages of 30 V often operate at higher speeds approaching 1 MHz. Therefore, it may be desirable to minimize switching or dynamic power loss caused by these capacitances. The magnitude of these capacitances are directly proportional to gate charge Qg, gate-drain charge Qgd and output charge Qoss. Furthermore, for a device that operates in the third quadrant (i.e., when a drain-body junction becomes forward biased), minority charge is stored in the device during its forward conduction. This stored charge causes a delay in switching from conducting to non-conducting. To overcome this delay, a body diode with fast reverse recovery is desirable. However, a fast recovery body diode often causes high electromagnetic interference (EMI). This means that during diode recovery, the ratio between the negative going waveform ($t_a$) and the positive going waveform ($t_b$) must be less than one for a soft recovery which avoids EMI problem.

As switching speed requirements increase to 1 MHz and beyond with new applications, state of the art power MOSFETs are increasingly unable to operate at such high speeds with satisfactory efficiency. A power MOS transistor that has low charges Qg, Qgd, Qoss and Qrr in addition to having a low specific on-resistance (Ron*A), is desirable.

Figure 1:
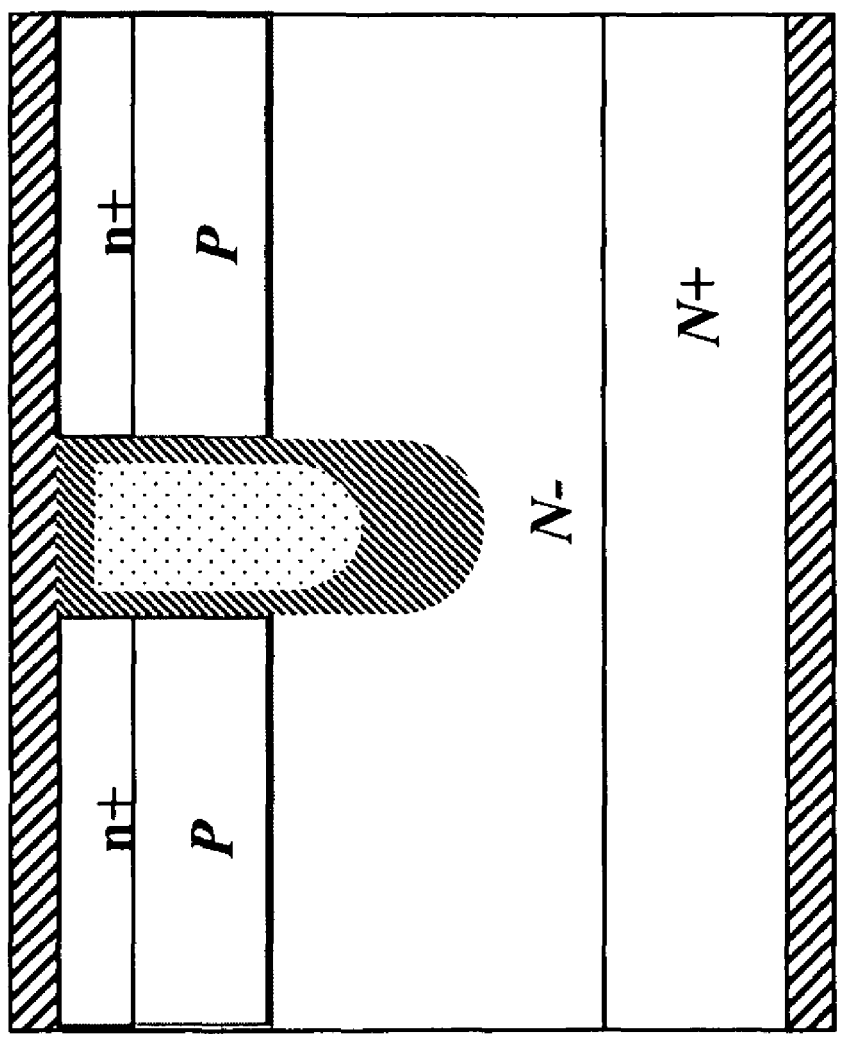
FIG. 1 is a cross-sectional view of a prior art MOSFET with a trench gate having a thick bottom oxide structure.
Figure 2:
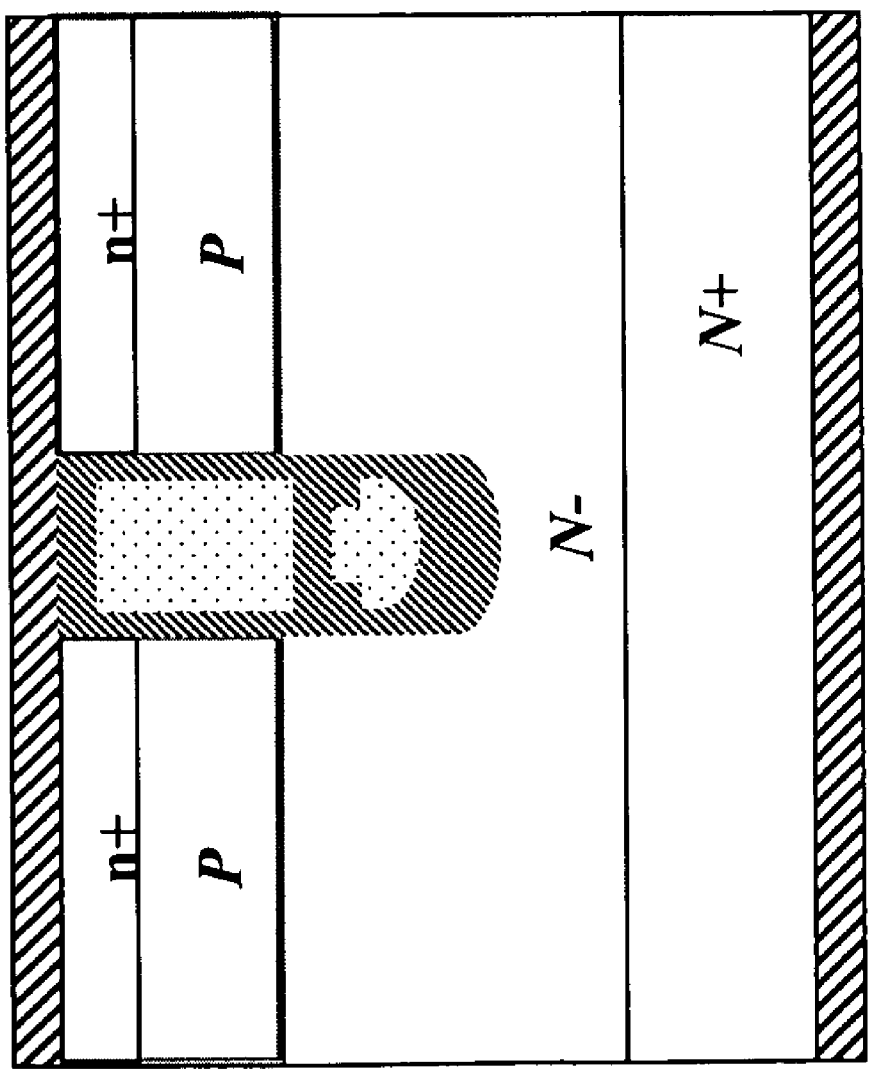
FIG. 2 is a cross-sectional view of a prior art MOSFET with a split poly gate structure.

There are two common techniques to improve the switching performance of power MOSFETs. The first one is the trench-gated MOSFET with thick bottom oxide, as shown in FIG. 1 (U.S. Pat. No. 6,849,898). The second one is the split poly gated MOSFET structure, in which the first poly gate is electrically shorted to the source electrode (U.S. Pat. Nos. 5,998,833, 6,683,346), as illustrated in FIG. 2.

Figure 3:
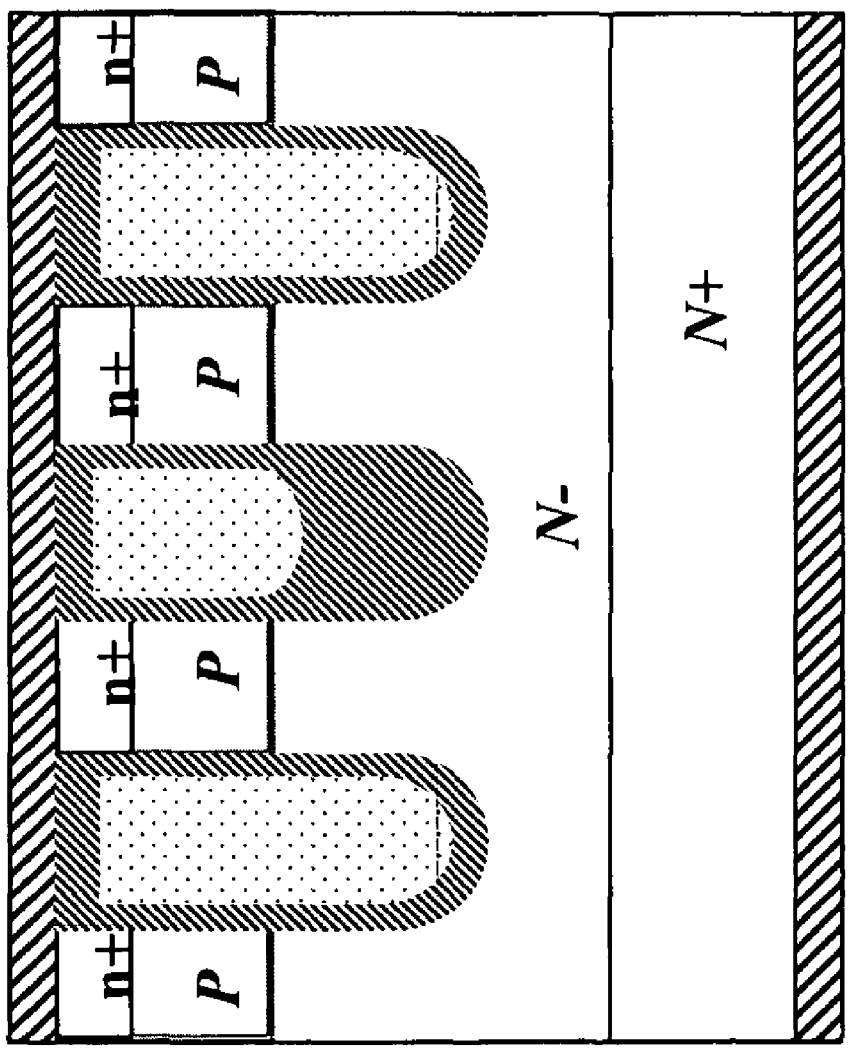
FIG. 3 is a cross-sectional view of a prior art MOSFET with RFPs in parallel with the gate trench.

Recently, as shown in FIG. 3, US Patent Application No. 2008/0073707 A1 to Darwish disclosed a power MOSFET with the recessed field plate (RFP) structure which realize a very short channel region (~0.25 um) for further reducing the gate-source capacitance and the gate-drain capacitance, and consequently, the total gate charge (Qg) and the "Miller" charge (Qgd). The RFP structure additionally improves the body diode reverse recovery speed due to providing an additional path for current and the enhanced depletion of the drift region induced by the RFP.

The present application discloses improvements to power insulated-gate field effect transistors with Recessed Field Plate (RFP) and similar structures. The inventors have realized that the performance of RFP-type power MOSFETs can be improved by performing a compensating implant into the RFP trench. This compensating implant helps to shape the depletion boundaries in the OFF state, and thus helps to avoid punchthrough. Because of this, a local enhancement can also be added to the doping between channel and drain, in the drift or spreading region. This provides a synergistic combination, wherein the on-resistance can be improved with no degradation in breakdown voltage.

The disclosed innovations, in various embodiments, provide one or more of at least the following advantages. However, not all of these advantages result from every one of the innovations disclosed, and this list of advantages does not limit the various claimed inventions.

Improved (reduced) on-resistance;
Improved (increased) breakdown;
Reduced electrical stress on any dielectric layer at the bottom of the RFP trench;
Higher reliability and longer operation life; and/or
Increased ability to increase local doping concentration in the drift region.

The numerous innovative teachings of the present application will be described with particular reference to presently preferred embodiments (by way of example, and not of limitation). The present application describes several embodiments, and none of the statements below should be taken as limiting the claims generally.

For simplicity and clarity of illustration, the drawing figures illustrate the general manner of construction, and description and details of well-known features and techniques may be omitted to avoid unnecessarily obscuring the invention. Additionally, elements in the drawing figures are not necessarily drawn to scale, some areas or elements may be expanded to help improve understanding of embodiments of the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

It is contemplated and intended that the design apply to both n-type and p-type MOSFETs; for clarity reason, the examples are given based on n-channel MOSFET structure, but an ordinary person in the art would know the variations to modify the design to make a similar p-channel device.

The present application discloses improvements to power insulated-gate field effect transistors with Recessed Field Plate (RFP) and similar structures. The inventors have realized that the performance of RFP-type power MOSFETs can be improved by performing a compensating implant into the RFP trench. This compensating implant helps to shape the depletion boundaries in the OFF state, and thus helps to avoid punchthrough. Because of this, a local enhancement can also be added to the doping between channel and drain, in the drift or spreading region. This provides a synergistic combination, wherein the on-resistance can be improved with no degradation in breakdown voltage.

In one sample embodiment, the RFP containing MOSFET has a buried Deep compensated zone floating in the N body region underneath the RFP trench. The Deep compensated zone reduces the voltage across the dielectric layer between the RFP and the N-epitaxial layer when a high drain-source voltage is applied.

In one sample embodiment, the RFP containing MOSFET has a buried Deep compensated zone floating in the N body region underneath the RFP trench and a local enhancement to the doping between channel and drain, in the drift or spreading region in the N epitaxial layer.

In one embodiment, the RFP containing MOSFET also has a deep P+ region in the P body in contact with the RFP trench wall that extends from the P body into the N epitaxial layer.

In one embodiment, the Deep compensated zone underneath the RFP trench extends to and is connected to the source electrode.

In one embodiment, the Deep compensated zone underneath the RFP trench extends to P body region that is in contact with the side walls of the RFP trench.

In one embodiment, the Deep compensated zone is a very lightly doped p region; while in another embodiment, the Deep compensated zone is a very lightly doped n region.

Figure 4A:
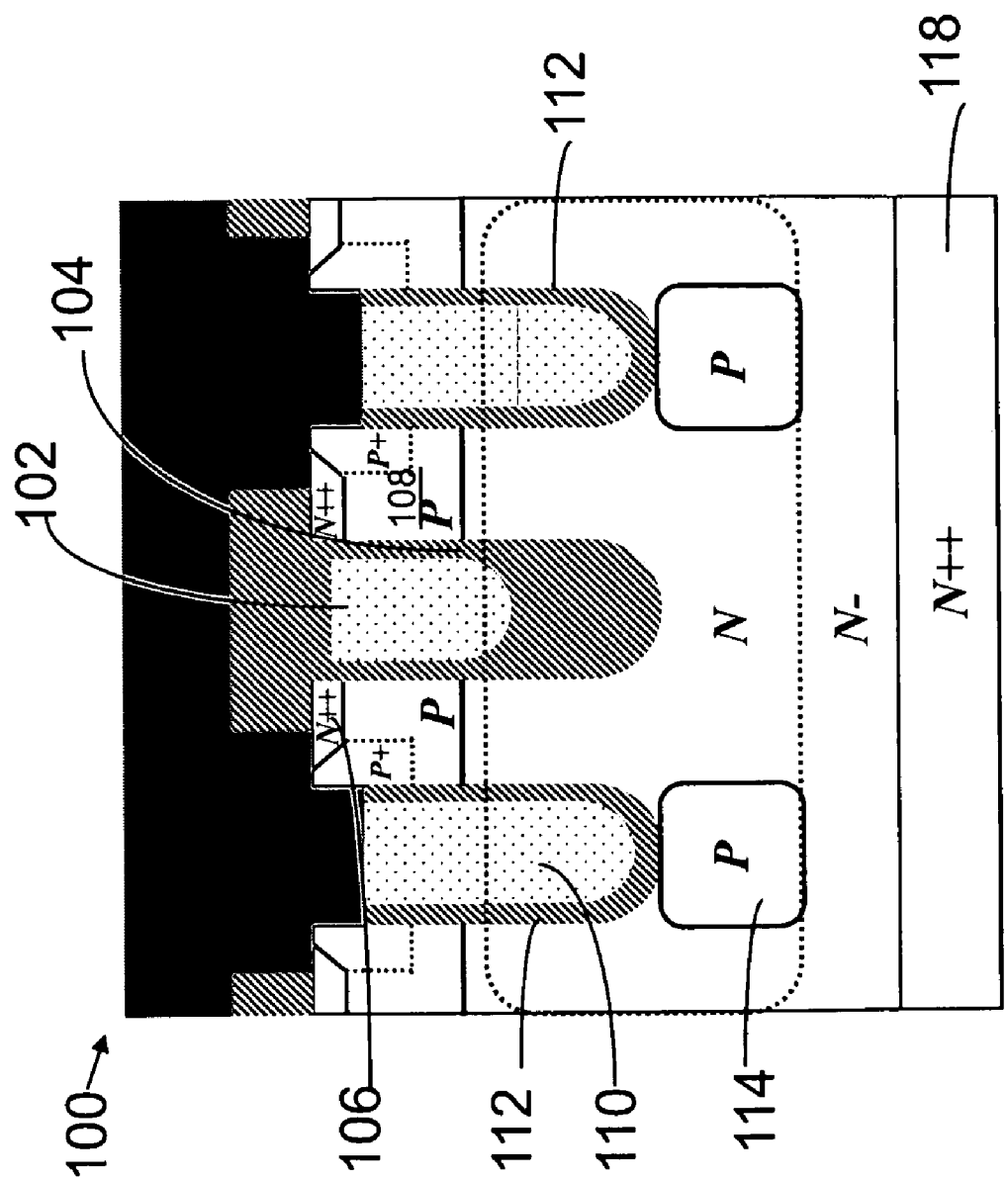
FIG. 4(*a*) is a cross-sectional view of an RFP containing MOSFET structure with a floating Deep compensated zone.

Referring now to FIG. 4(a), a semiconductor device structure 100 comprises a gate 102 which is positioned in a first trench 104, also described herein as a gate trench 104. The first trench 104 containing the gate 102 may be one of many gate trenches within the semiconductor device structure 100. The semiconductor device structure 100 is capacitively coupled to control vertical conduction from a source region 106, having a first-conductivity-type, through semiconductor material 108, which is adjacent to the first trench 104.

As shown in FIG. 4(a), the gate 102 has a gate electrode comprising conductive gate material having a width approximately equal to a width of the gate trench 104. It will be appreciated that, although the gate electrode may have a width that is approximately equal to the width of the gate trench 104, the gate electrode may alternatively be contacted using a wider gate trench and a smaller gate electrode, allowing the gate trench to be insulated from the gate conductor.

The semiconductor device structure 100 also includes recessed field plates 110, which are positioned in proximity to and capacitively coupled to the semiconductor material 108. The recessed field plates 110 are positioned in respective second trenches 112, also described herein as RFP trenches 112. Each of the trenches (i.e., the respective second trenches 112 and the gate trenches) has trench walls that are coated with an insulating material, such as silicon dioxide ($SiO_2$). The RFP trenches 112 contain an insulating material having a breakdown voltage which preferably exceeds the breakdown voltage of the semiconductor device structure 100. The gate trench 104 preferably contains an insulating material up to the p-body drain junction, minimizing any overlap of the gate electrode (connected to the gate 102) with the drain or drift region.

In one embodiment, the gate trench contains thick bottomed insulation dielectric material such as silicon dioxide. In another embodiment, the insulating material within the RFP trench and/or the gate trench 104 has a stepped thickness. Providing a stepped thickness can help shape the channel and can help control "hot" electron effects.

Conductive material, such as n-type doped polysilicon, forms a gate electrode electrically separated from the gate trench 104 by the insulating material. The conductive material may be silicided to reduce its resistance. Conductive material also fills the RFP trenches 112, electrically separated from the gate trench 104 by the insulating material, and extending above the RFP trenches to form a plurality of RFP electrodes. Each of the trenches may be of substantially equal depth, or may differ in depth, and may be self-aligned by being etched at the same processing step, although the RFP electrode is deeper than the gate electrode and is either independently biased or connected to a source electrode (i.e., the source 106), and a source region (including the source electrode) may extend between the gate 106 and the RFP trenches 112.

In one embodiment, the n-epitaxial drift region is uniformly doped. In another embodiment, the n-epitaxial drift region is not uniformly doped. Specifically, the doping is graded to have a doping concentration that is higher at an interface with the underlying 118 substrate and decrease toward the surface. Non-uniform doping of the drain drift region allows for greater shaping of the channel and for control over "hot" electron injection.

The source region may be doped n+. The gate trench 104 and the RFP trench may have a thin layer of the insulating material, reducing on-resistance, or a thick layer of the insulating material, providing greater electrical isolation increasing reverse-bias breakdown voltage. In the embodiment depicted, the RFP electrodes have a uniform depth. In another embodiment, at least one of the RFP electrodes extends up and contacts the source 106.

Advantageously, the semiconductor device structure 100 also includes deep compensated zones 114 of either p-type or n-type lying at least partially beneath the respective RFP trenches 112. The deep compensated zone 114 may be floating islands of either p-type dopant concentration regions (as shown in FIG. 4a), or lightly doped n-type dopant concentration regions in the N-drift region underneath the RFP trenches. The drawing shows the boundaries of this compensated zone 114 as if it had been fully counterdoped, but those of ordinary skill will understand that the boundaries of a compensated but not counterdoped zone can be similarly envisioned, using e.g. the concentration contours of a single dopant species.

The deep compensated zones 114 also reduce the voltage across the dielectric layer between the RFP and the N-epitaxial layer when a high drain-source voltage is applied.

Figure 4B:
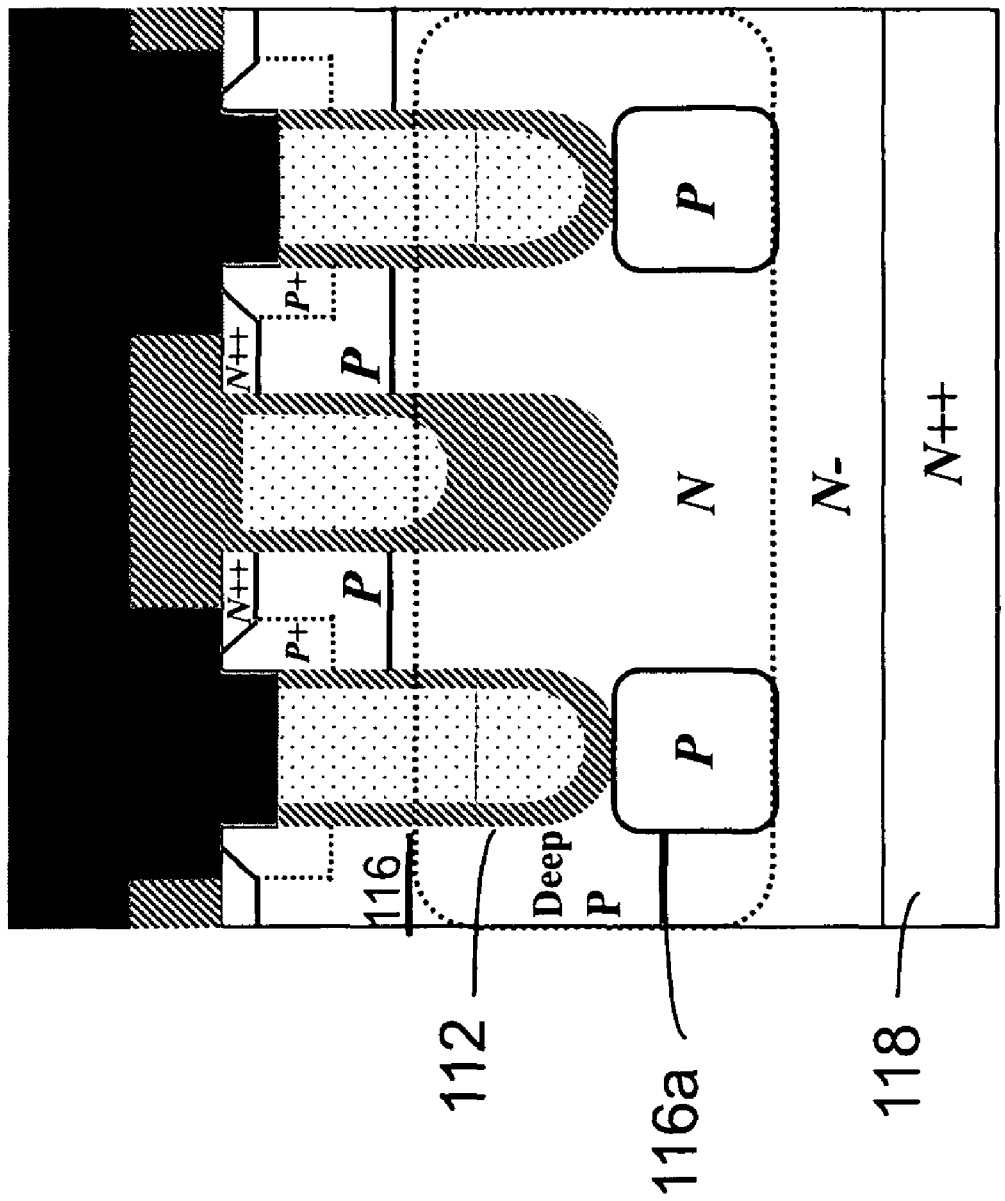

As shown in FIG. 4(b), device 100 also contains a deep p-body region 116 that is in contact with the side walls of the RFP trench 112. The deep p-body region 116 with boundary at 116a can be in connection with the source electrode and also be in connection with the deep compensated zones 114. The deep P-N junction in the edge termination can be formed by the Deep compensated implant and its related annealing without adding new mask. Therefore, the disclosed structure can offer a more reliable edge termination.

Figure 4C:
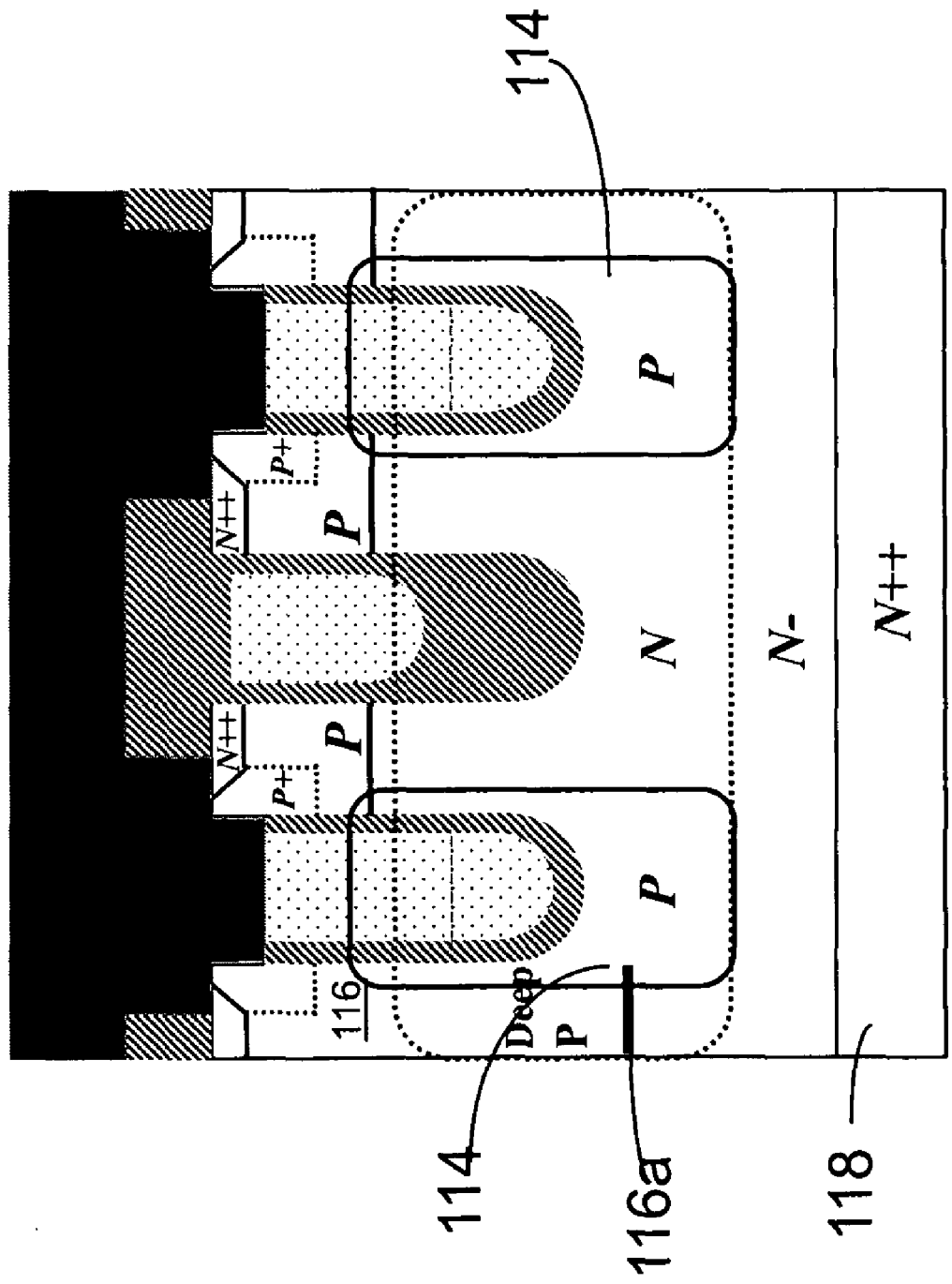

Alternatively, as shown in FIG. 4(c), the deep compensated zones 114 can extend vertically and merge with the p-body region.

Figure 5:
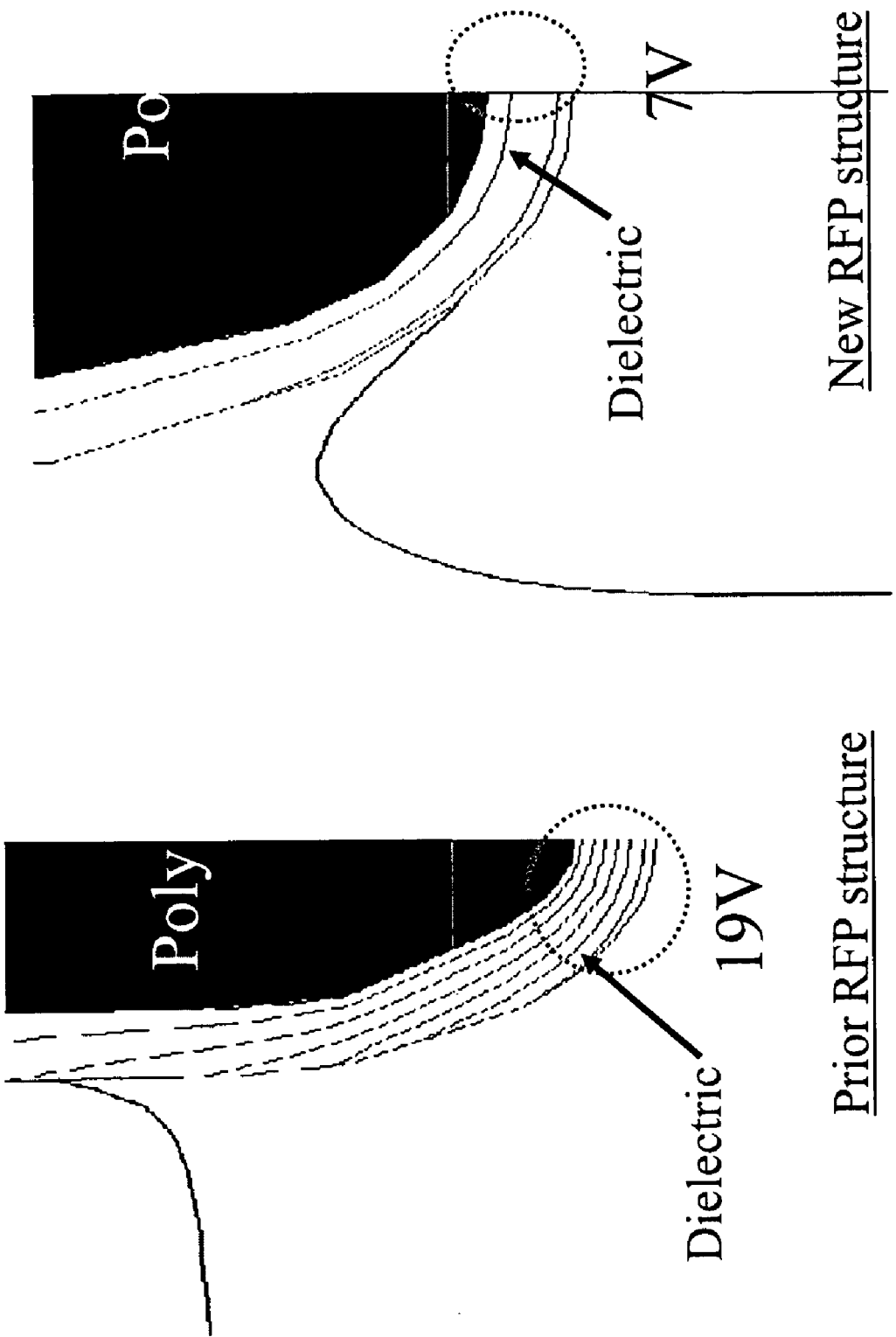
FIG. 5 shows a two-dimensional electrical voltage simulation comparison between the prior RFP-MOSFET structure and a MOSFET containing a Deep compensated zone.

The two-dimensional electric voltage simulation shown in FIG. 5, reveals that under the same bias conditions the conventional device of structure shown in FIG. 3 sees about 19V across the bottom dielectric layer between RFP and the N-epitaxial layer, while an embodiment of FIG. 4(a)-(c) only shows 7V across the bottom dielectric layer between RFP and the N-epitaxial layer due to the protection from the Deep compensated zone 114.

As the electrical stress on the bottom dielectric layer between RFP and drain is reduced significantly, the device structures of FIG. 4(a)-(c) will offer a higher reliability and longer operation life. In addition, the Deep compensated zones 114 enhance the lateral and vertical depletion of N-epitaxial layer, which provides room for higher local doping concentration in the epitaxial layer without degrading the device breakdown voltage.

The increase in local doping concentration in the epitaxial layer further reduces the on-resistance of drift region. By properly adjusting the doping concentration of P and N regions in the N-epitaxial layer, the total on-resistance of device can be lowered without reduction of the breakdown voltage. Furthermore, the local doping enhanced N layer also decreases the minority carrier injection efficiency of the body diode of the device and alters the electric field distribution during the body diode reverse recovery. Thus, the reverse recovery of the body diode is improved, resulting in a device having lower reverse recovery charge and soft recovery features.

Since the doping enhancement only occurs in the active region, the termination efficiency of the improved device edge junction termination region will not be degraded.

The recessed field plates 110 may be positioned in multiple respective trenches 112, which are separate from the gate trench 104. Accordingly, the semiconductor device structure 100 may be, for example, an n-channel MOSFET with a recessed field plate (RFP) trench 112 and a gate trench 104 formed on an N-type epitaxial layer grown over a heavily doped N+ substrate.

In third quadrant operation, in which where the drain 118 is negatively biased with respect to a source-body electrode (i.e. the source 106), and in which diffusion current results in minority carrier injection and a high reverse recovery charge Qrr, the plurality of RFP electrodes form majority carrier channel current path from drain to source in addition to that provided by the gate electrode in a conventional structure. The combined effect of the RFP electrodes and the gate electrode is both reduced minority carrier diffusion current and reduced recovery charge Qrr. Accordingly, in the third quadrant operation, the RFP electrodes act as an additional gate without any penalty of an added gate-drain capacitance Cgd.

In reverse-biased operation, the RFP also reduces any electric field in a channel region. Accordingly, shorter channel lengths are possible, without substantial risk of punch-through breakdown, further allowing reduction in Ron*A and Qg. The capacitive coupling between the gate trench 104, the RFP trenches 112 and the drain region further deplete the drain drift region, at a higher rate as a drain-source voltage VDS is increased in an off-state. The low Cgd and its fast falling rate, combined with increasing drain-source voltage VDS, provides a lower gate-drain charge.

The semiconductor device structure 100 can have a quasi-vertical or lateral configuration. Ensuring that the semiconductor device structure 100 has a quasi-vertical or lateral configuration can help shape the channel, and can reduce hot electron effects.

Various variations in gate conductor and RFP conductors may be used. Various combinations have been shown in US Application No. 2008/0073707 A1 to Darwish, the entirety of which is thereby incorporated by reference. Polysilicon may be used as the conductive material. Example variations in structural designs of gate conductor and RFP conductors include split poly configurations and single poly configurations (FIGS. 21-25), thick bottom oxide, and step shaped bottom oxide and the combinations of the various forms.

Figure 26:
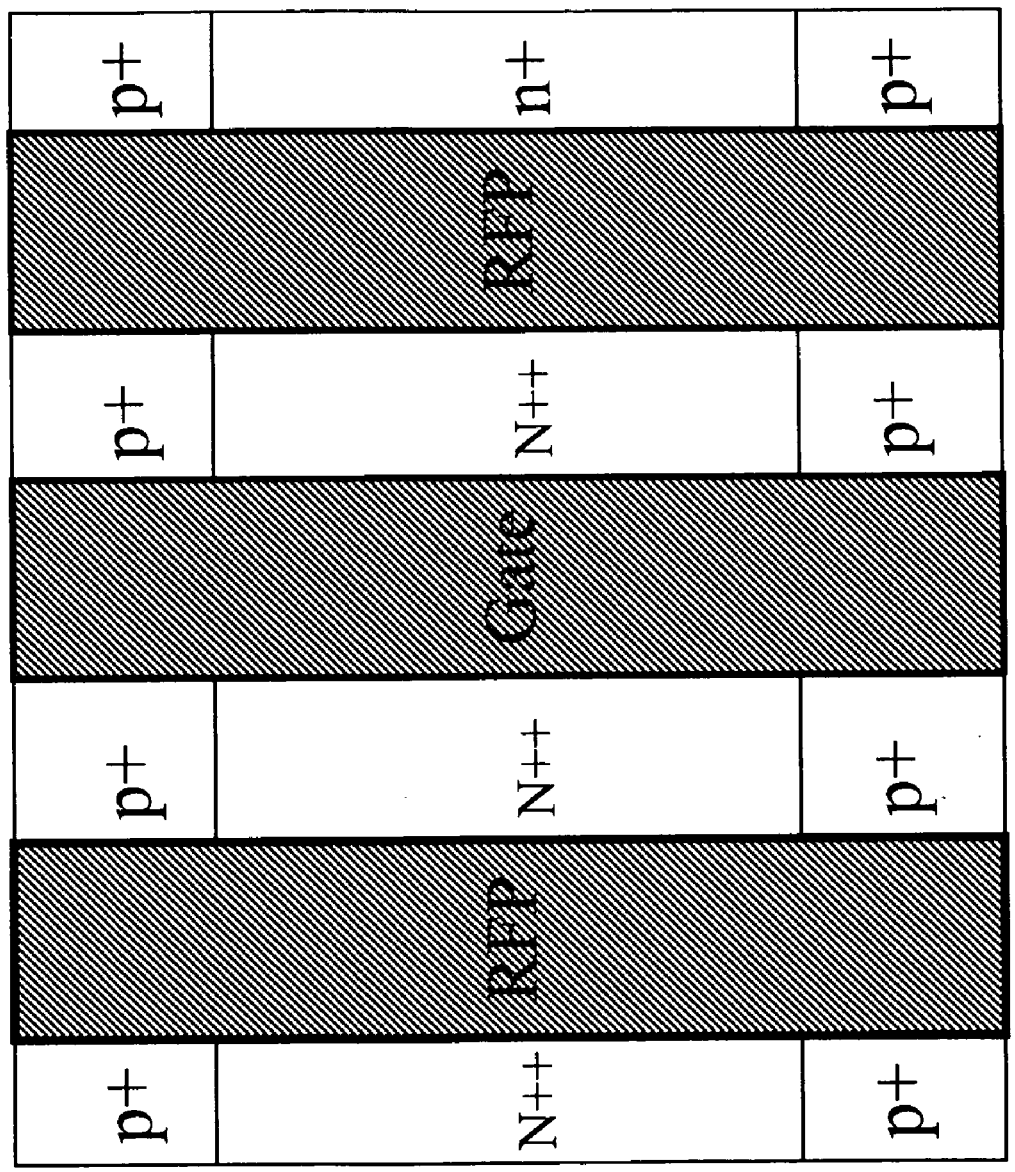
FIG. 26 shows a top view of an embodiment of FIG. 4(*a*) wherein the RFP region is a continuous strip in the horizontal direction.

Referring to FIG. 26, each of the foregoing embodiments may be implemented in a single configuration, a multi-stripe configuration, a cellular layout configuration, or a combination of the foregoing. Moreover, the polarity and conductivity type may be reversed.

Figure 27:
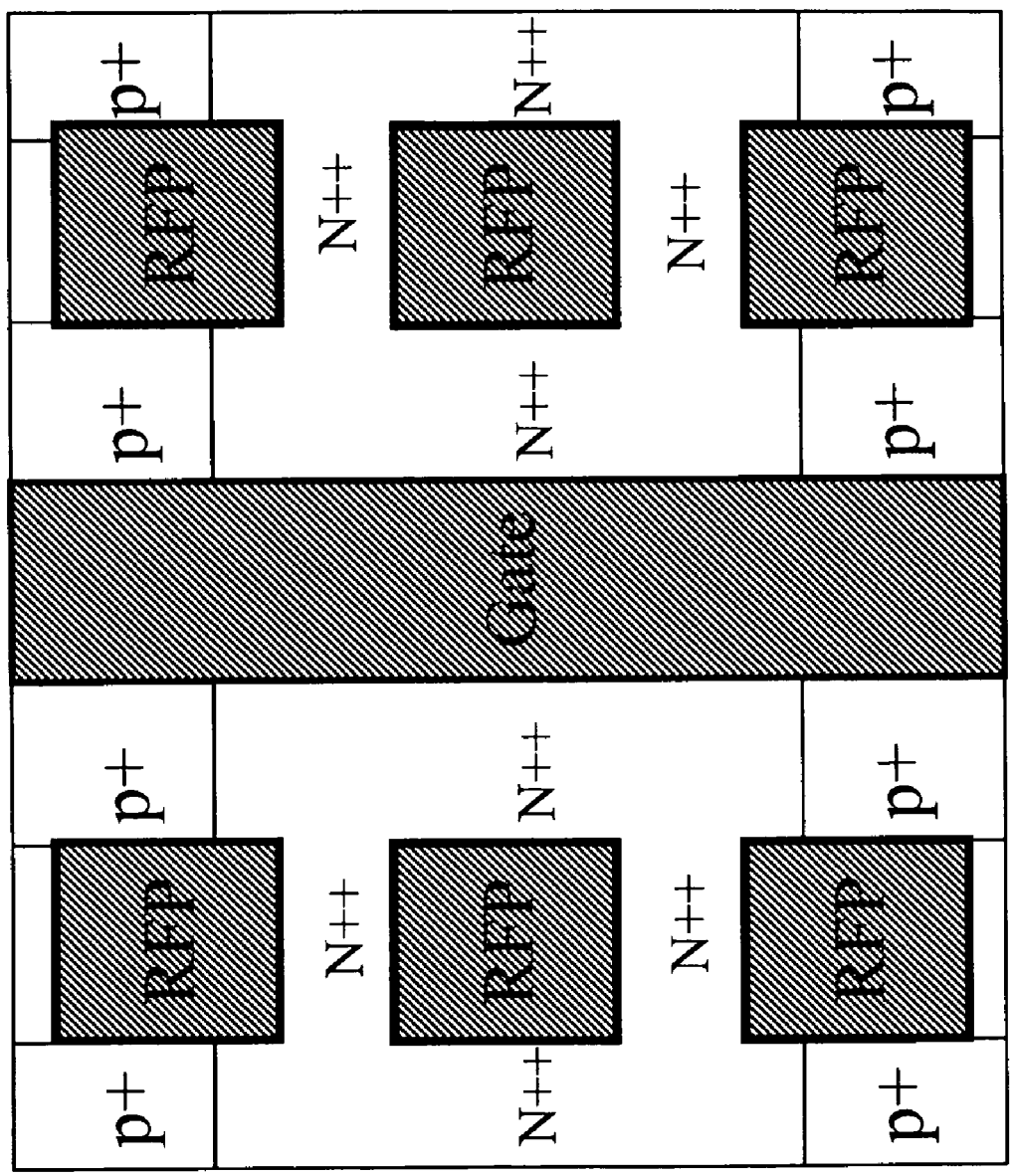
FIG. 27 shows a top view of an embodiment of FIG. 4(*a*) wherein the RFP region is divided into several columns in the horizontal direction.

Referring to FIG. 27, each of the foregoing embodiment RFP may also be implemented in an interrupted manner where the RFP trenches and conductors form columns in the source-body-drain layers of the device. With this interrupted scheme, more N++ surface area can be provided, reducing the N++ resistance, and lowering the total on-resistance.

Figure 6:
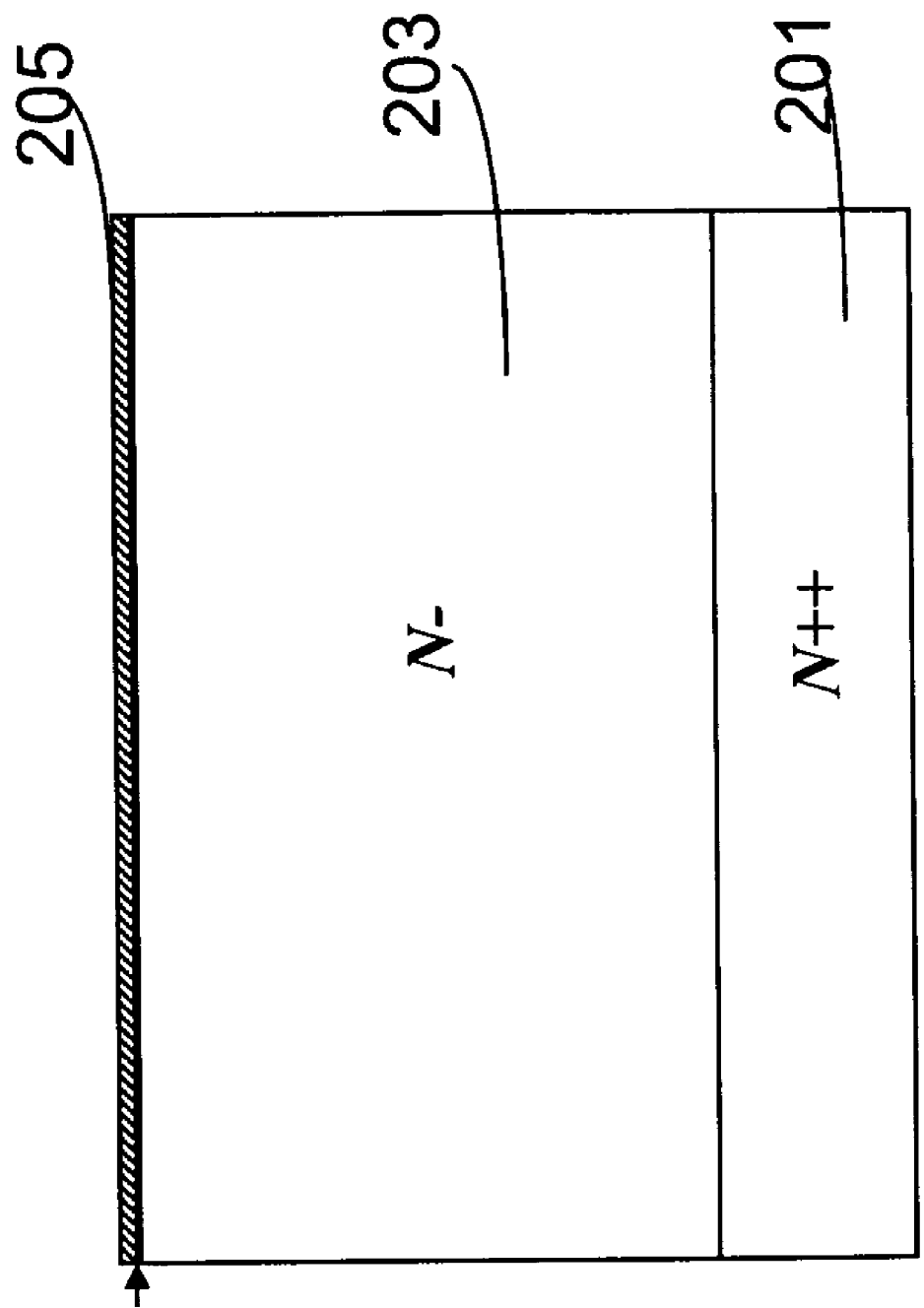
Figure 7:
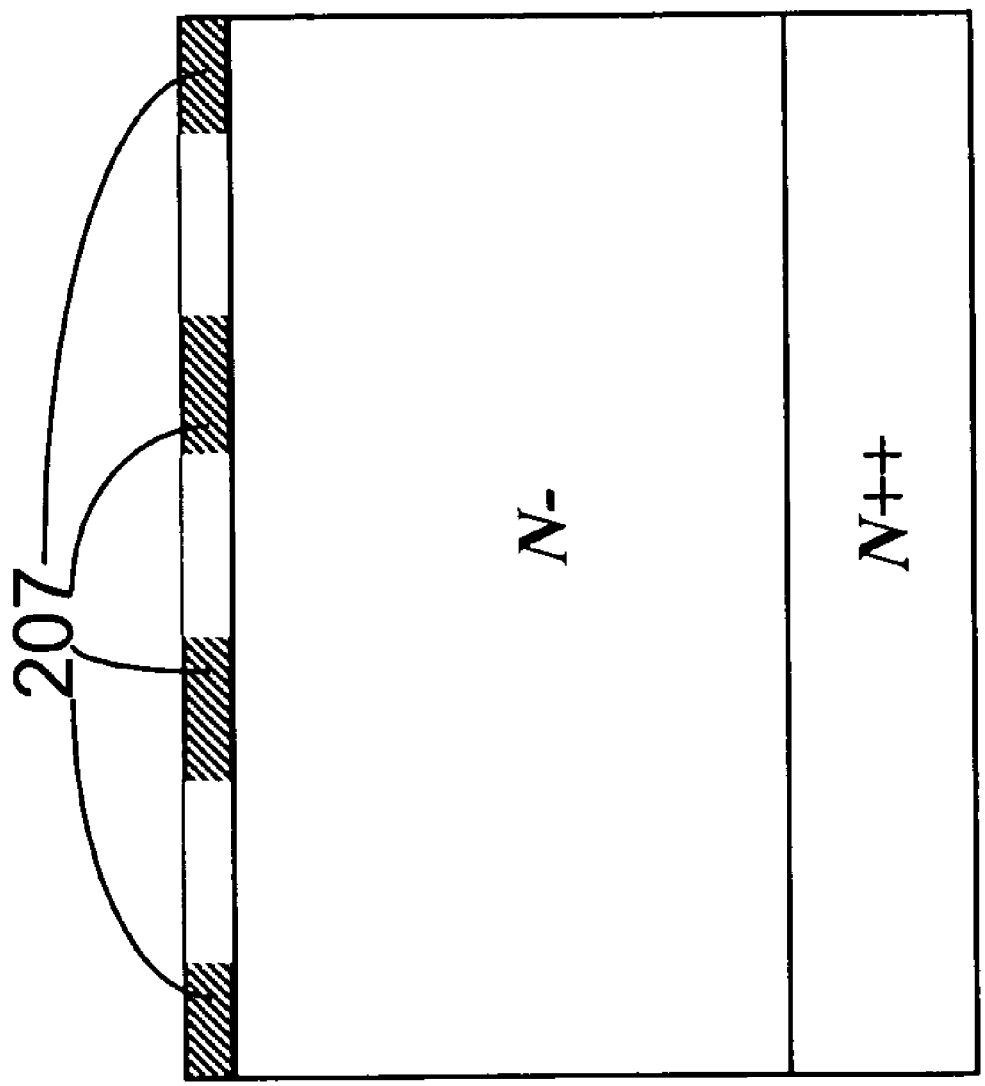
Figure 8:
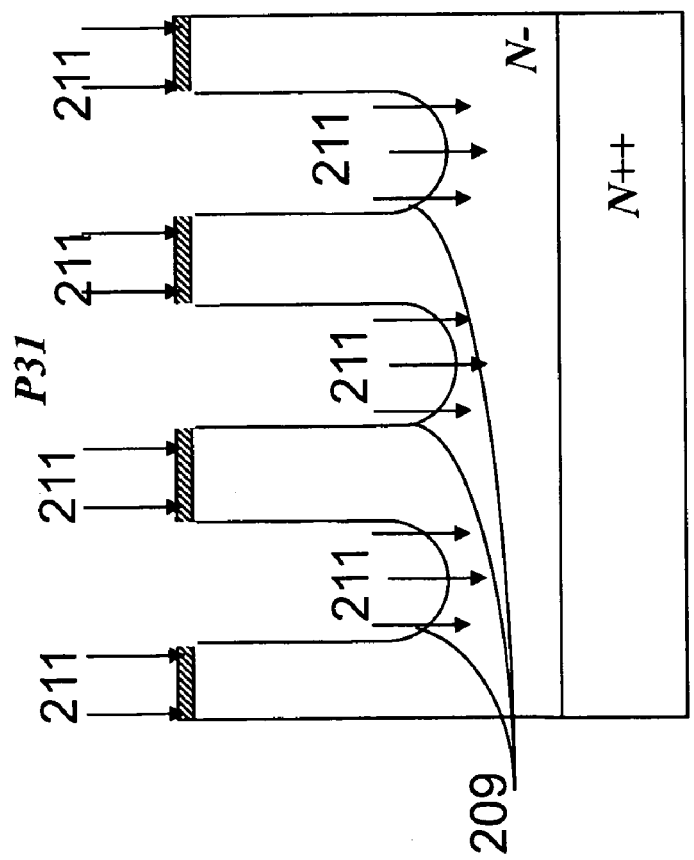

A fabrication process for making the described embodiment is detailed in FIG. 6-18. In FIG. 6, starting with N++ substrate 201, the N-epitaxial layer 203 is grown followed by forming a thin layer of silicon oxide layer 205. Substrate 201 may have been doped with phosphorus or arsenic. The preferred thickness for oxide layer 205, for example, can be 200-300 Å. In FIG. 7, the trench mask 207 is applied to form the hard mask for trench etching and the oxide layer is etched Then a standard silicon etch step is carried out to form the plurality of trenches 209 according to the mask. In FIG. 8, blanket implanting of phosphorus ions 211 (e.g. $P^{31}$) to the whole device may be performed to locally increase the doping concentration of N-epitaxial layer. The implantation is preferred to be done at tilt of 0 degree. The trench mask around the edge termination area or the gate bus area (not shown in Figures) prevents the phosphor dopant getting into these areas. Therefore, only the active region of the device receives the doping enhancement implant.

Figure 9:
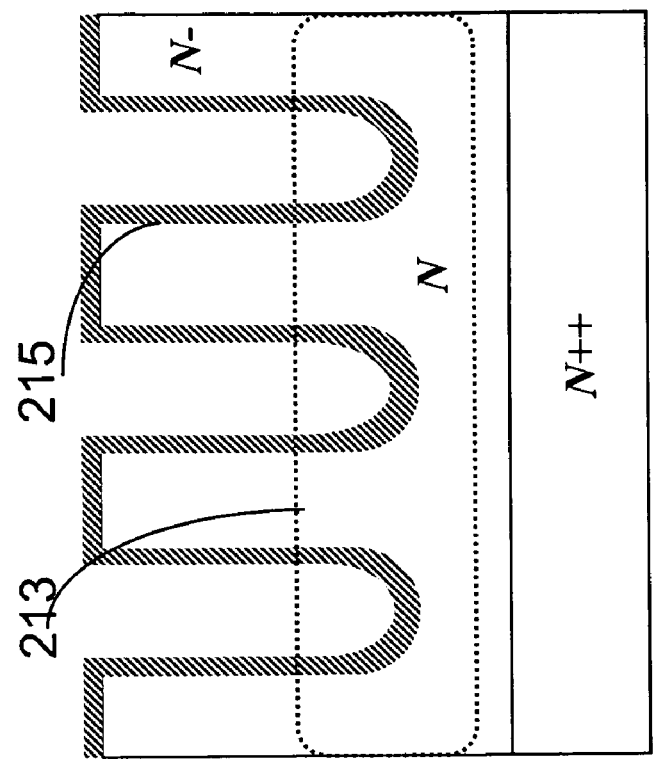
Figure 11:
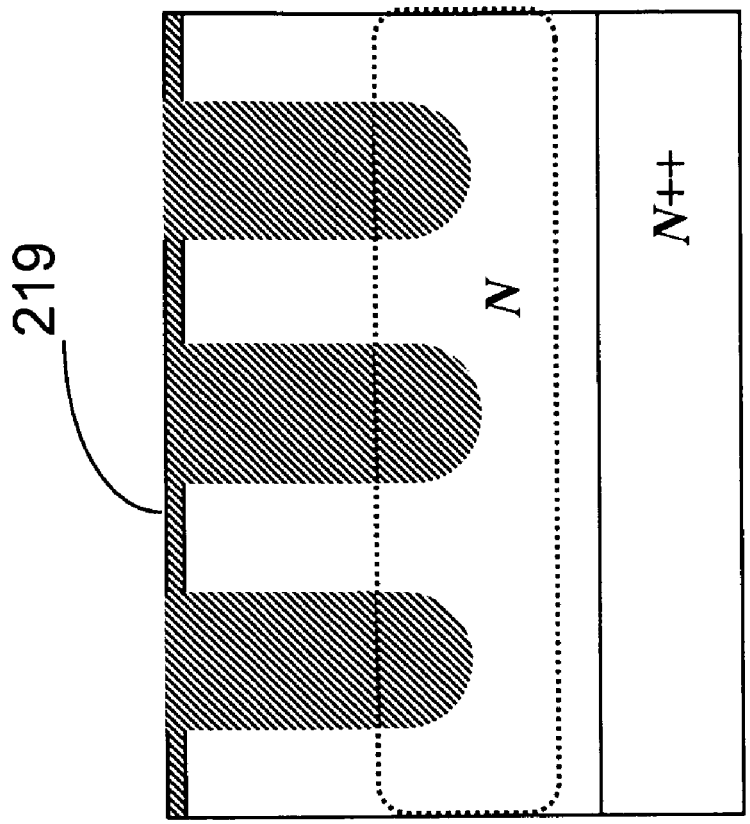
Figure 10:
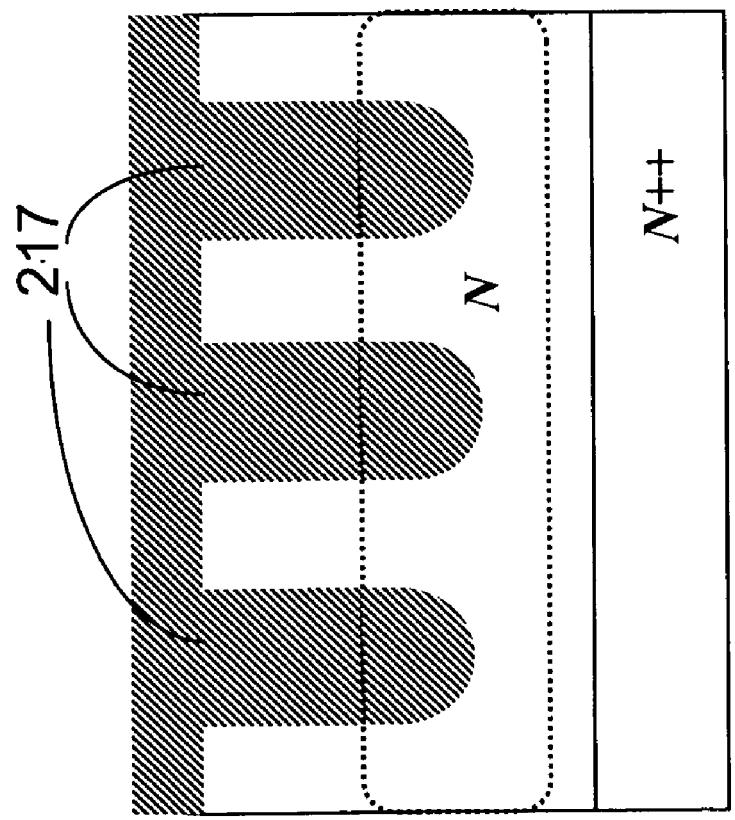

After implantation a high temperature process in an oxygen-containing ambient is used to anneal and diffuse the phosphorus dopant. Consequently, a doping enhancement N layer 213 is formed inside N-epitaxial layer as shown in FIG. 9. The trench walls may then be oxidized first using a sacrificial oxidation. After removing the sacrificial oxide layer a pad oxide is re-grown along trench side wall. In FIG. 10, the trenches are filled with high density oxide 217. Oxide 217 may include silicon dioxide, or other types of deposited oxide, such as LTO or TEOS or High Density Plasma (HDP) oxide. The oxide is then thinned as shown in FIG. 11 using a dry plasma etch or CMP technique to planarize the oxide surface 219.

In FIG. 12, after active mask 223 has been applied with openings over trenches 222, the oxide is etched further down into trench forming the trench Bottom Oxide layer (BOX) 221. Then, in FIG. 13, the BOX mask is used to protect the active gate trench 225 and the edge termination areas (not shown). The oxide removal step is carried out to completely etch away the BOX inside the RFP trench. Before removing the BOX mask, boron-11 ions 229 are implanted into N/N-epitaxial layer through RFP trench bottom 231, forming P layer or isolation zones 237 shown in FIG. 14.

In one embodiment, to implement the structure shown in FIG. 4(c), a tilt angle implant is used to introduce boron along the RFP side walls. After removal of BOX photoresist 233 an optional high temperature anneal is employed to diffuse the boron, forming P layer or isolation zones 237 inside N-epitaxial region. Then the gate oxide 235 is grown along the trench sidewall in FIG. 14.

Figure 15:
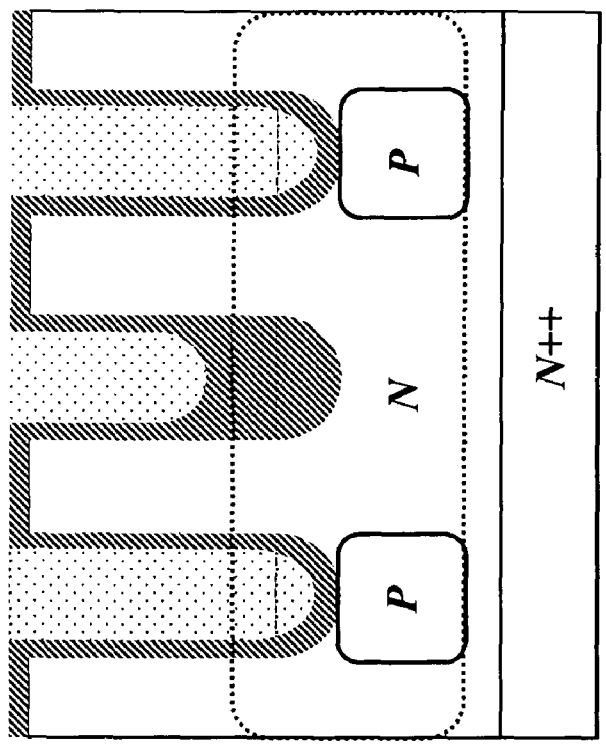
Figure 14:
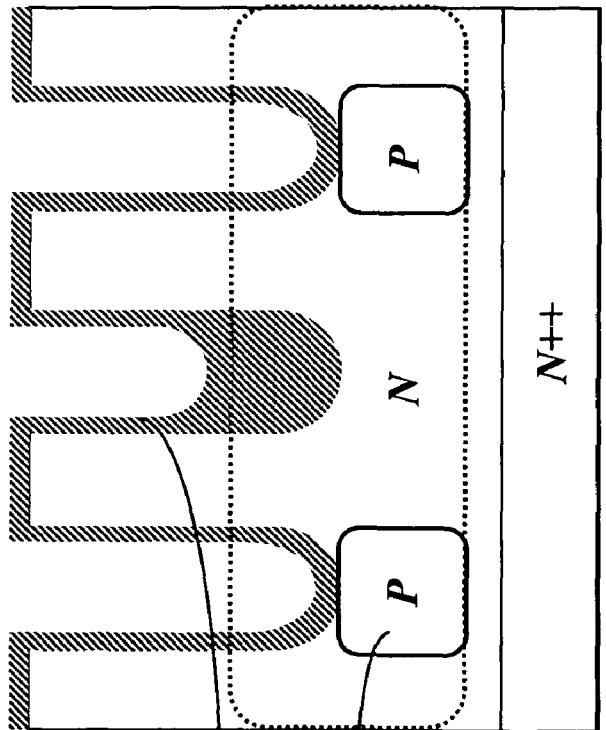
Figure 17:
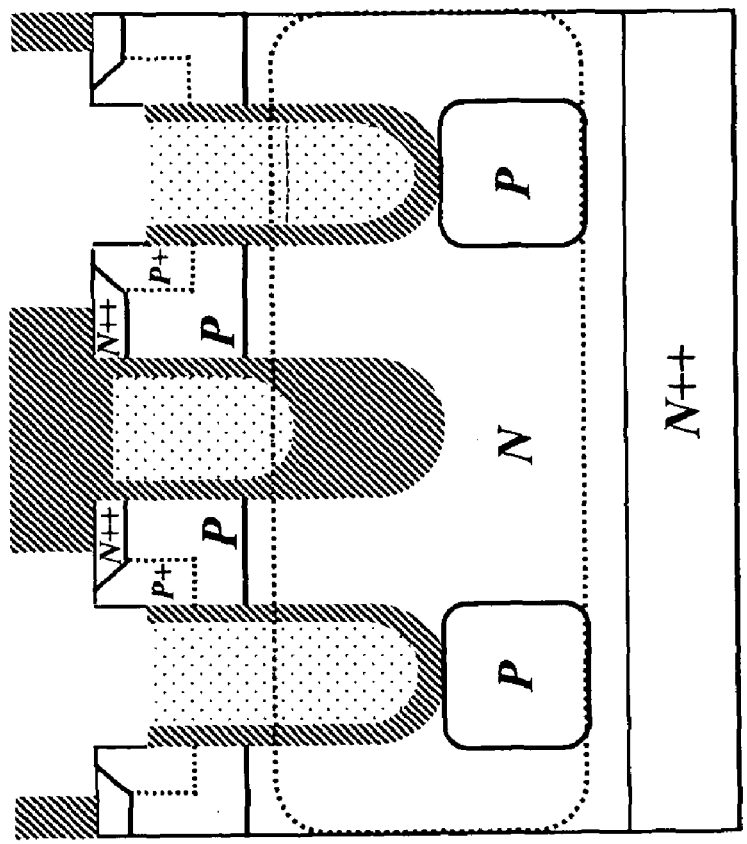
Figure 16:
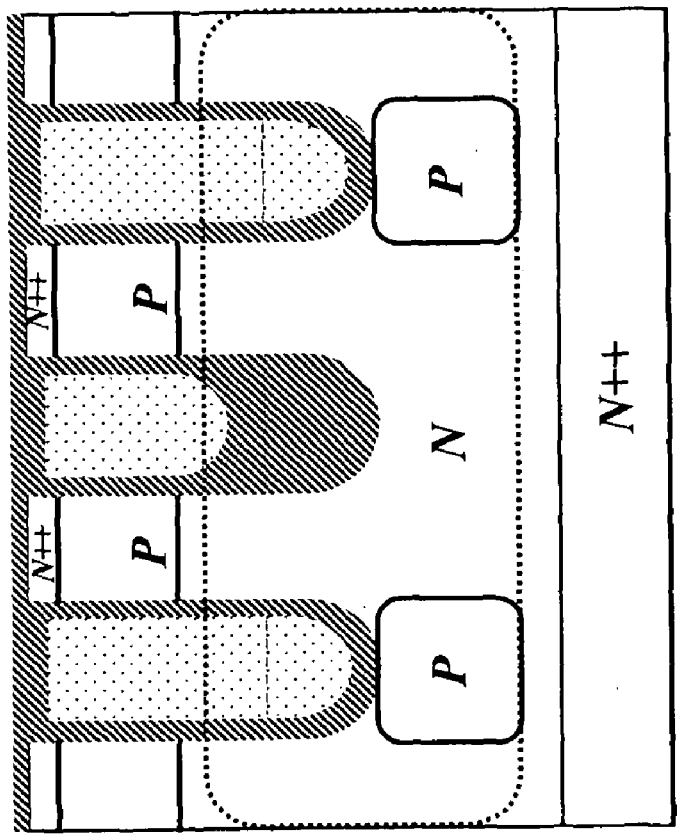
Figure 18:
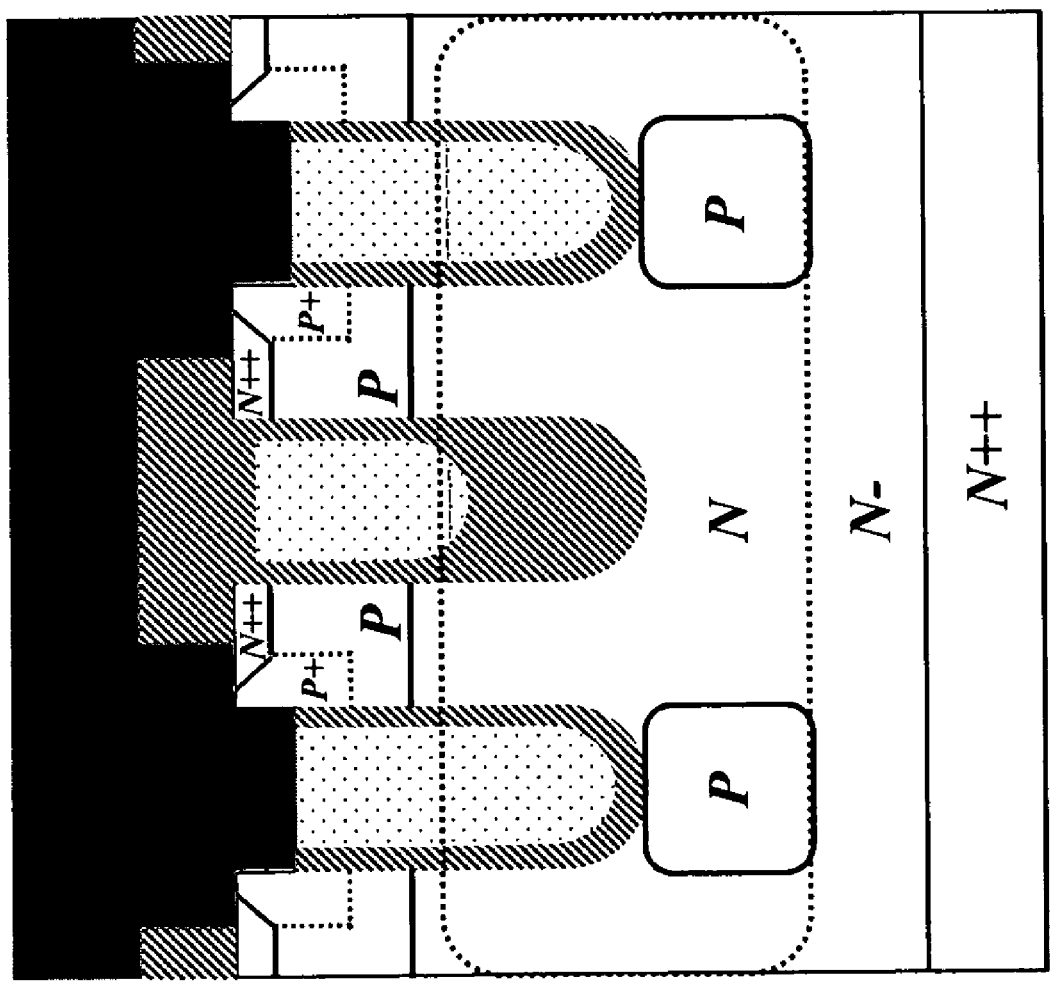
Figure 19A:
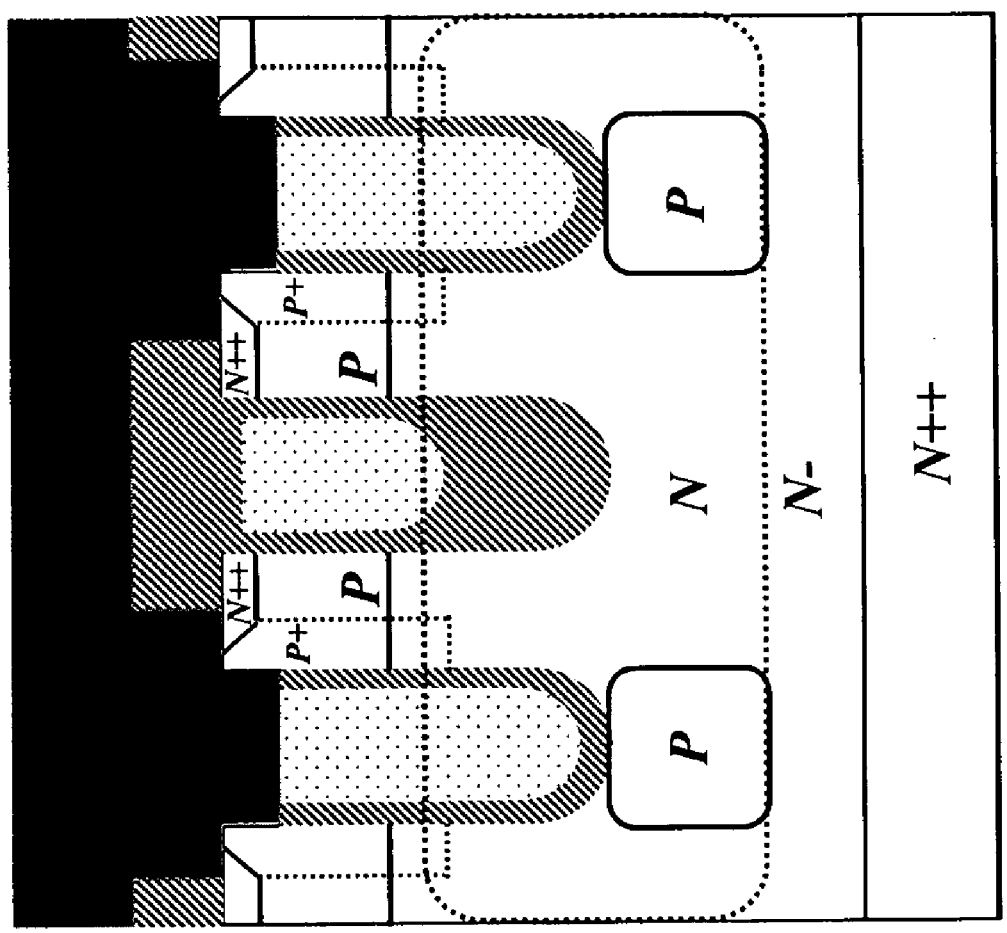
FIG. 19A is a cross-sectional view of a RFP containing MOSFET structure with a Deep compensated zone and a P+ implant region extending beyond the P-N junction and into the N drift region.
Figure 19C:
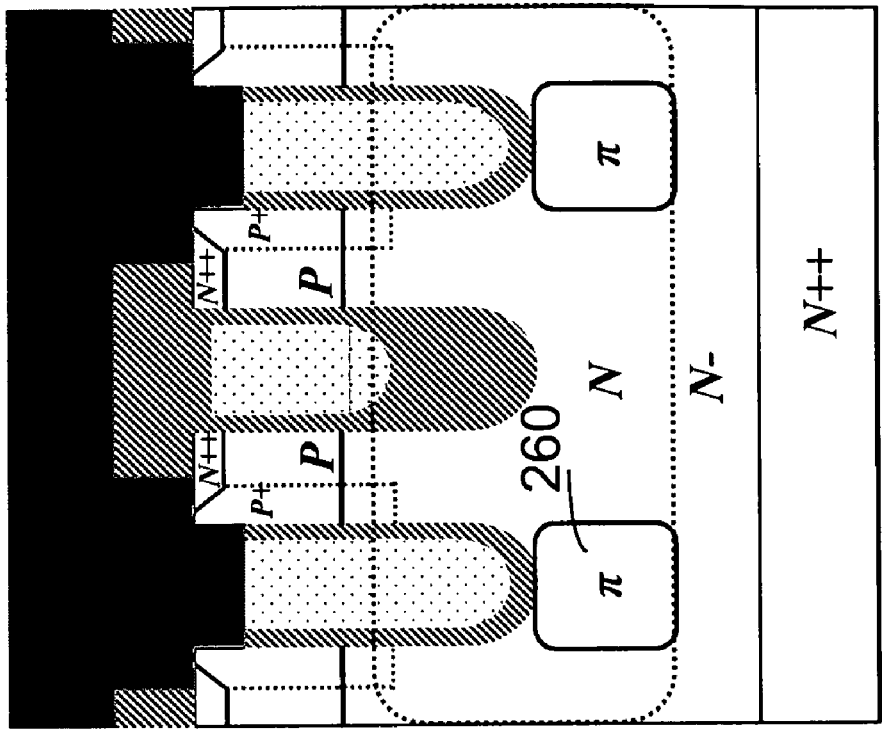
FIG. 19C is a cross-sectional view of an RFP containing MOSFET structure with a Deep compensated zone that is a lightly doped n region, and a P+ implant region extending beyond P-N junction and into the N drift region.
Figure 19B:
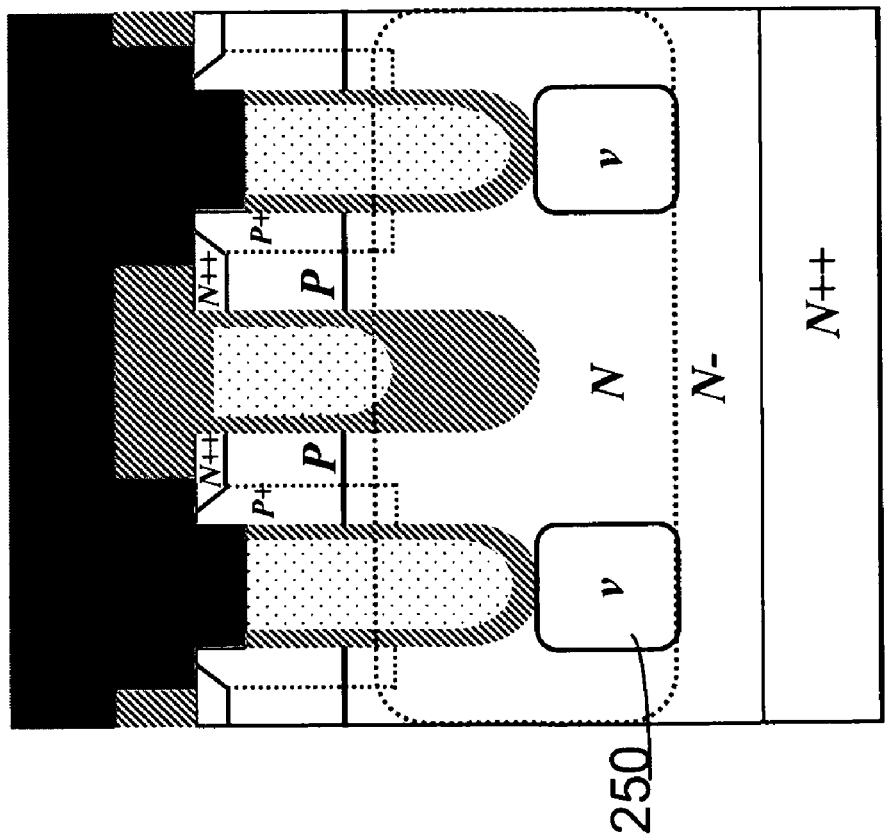
FIG. 19B is a cross-sectional view of an RFP containing MOSFET structure with a Deep compensated zone that is a lightly doped p region, and a P+ implant region extending beyond the P-N junction and into the N drift region.
Figure 20:
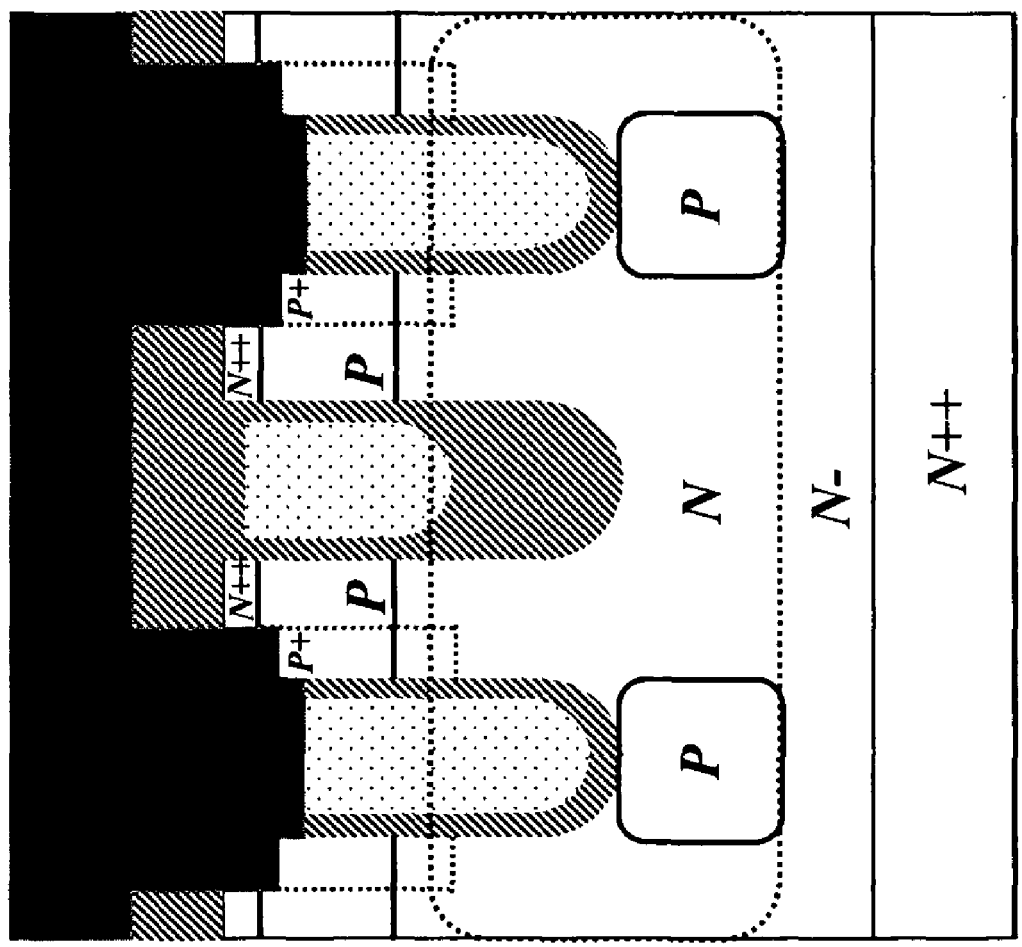
FIG. 20 is a cross-sectional view of an RFP containing MOSFET structure with a Deep compensated zone, and a P+ implant region extending beyond P-N junction and into the N drift region and the N++ source region that is completely recessed down.

The rest of process steps shown in FIG. 15 to FIG. 17 are similar to the one described in FIGS. 14-17 in US patent application No. 2008/0073707, which is herein incorporated by reference. The final device structure is shown in FIG. 18. It is essential to point out that, by properly choosing RFP poly recess depth combined with the implant energy of P+ implant, the P+ region can be made deeper than P body, as shown in FIG. 19A. Depending on the doping concentration of P shield region (or isolation zone), the P shield zone could be a "π" region 260 (a very lightly doped P region) shown in FIG. 19C or a "ν" region 250 (a very lightly doped n region) shown in FIG. 19B. A deeper P+ region is desired in order to improve the device ruggedness and connect the buried P region to the source electrode. In addition, the N++ source region can also be recessed completely as shown in FIG. 20, so that the N++ source mask-photo step can be eliminated.

Figure 22:
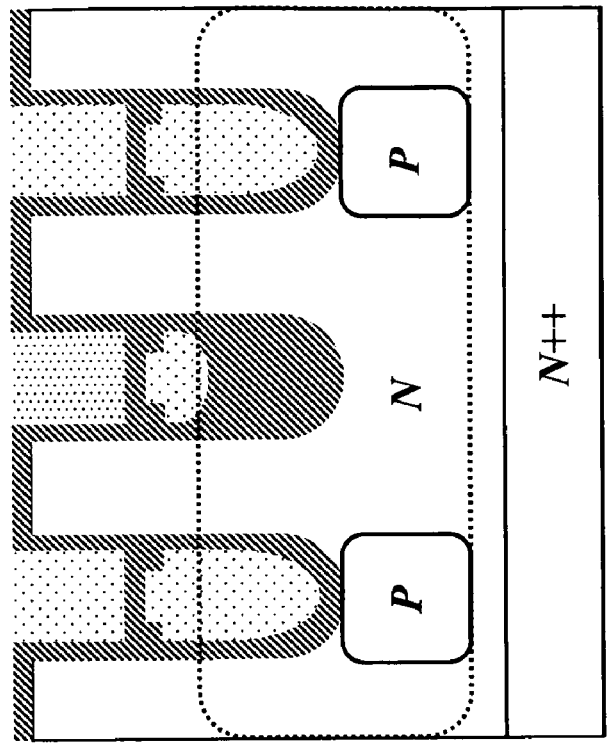
FIGS. 21-23 show a process for fabrication of an embodiment of FIG. 4(*a*) structure implemented in the split poly gated structure with split poly layer structure in the RFP trench.
Figure 21:
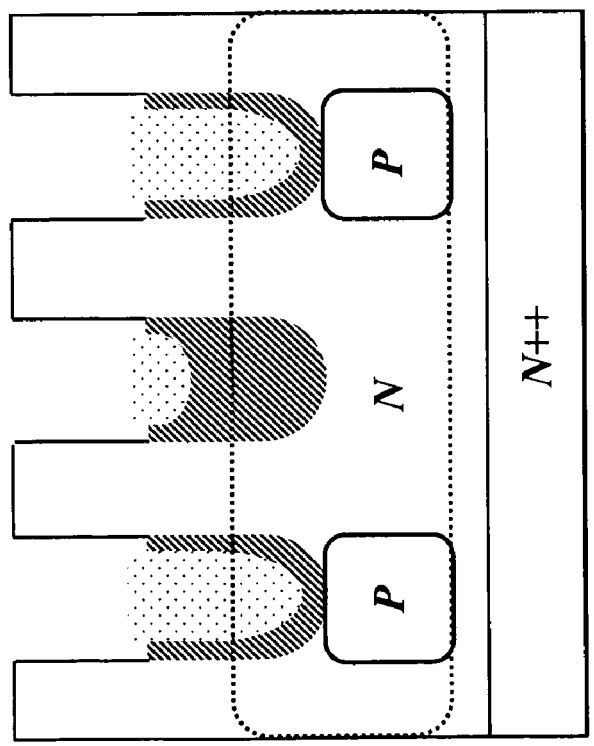
Figure 23:
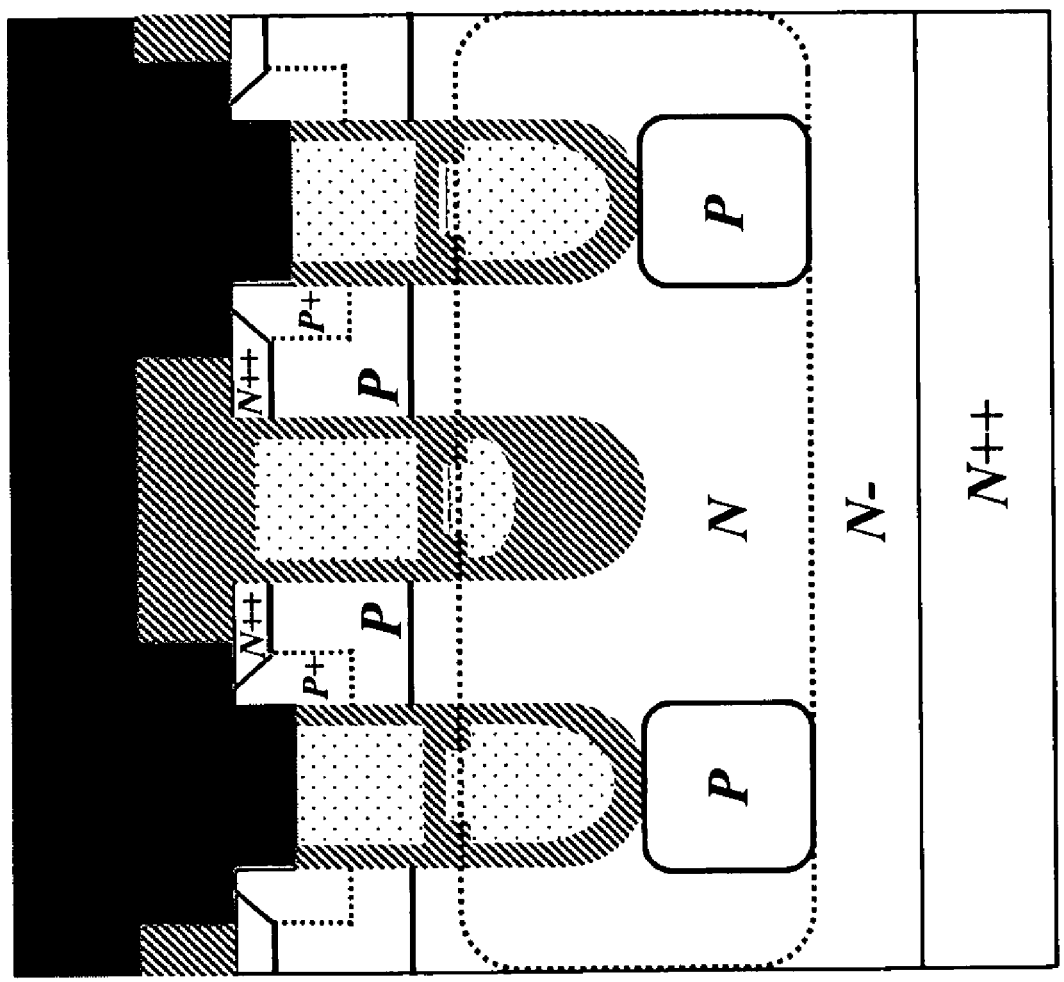
Figure 24A:
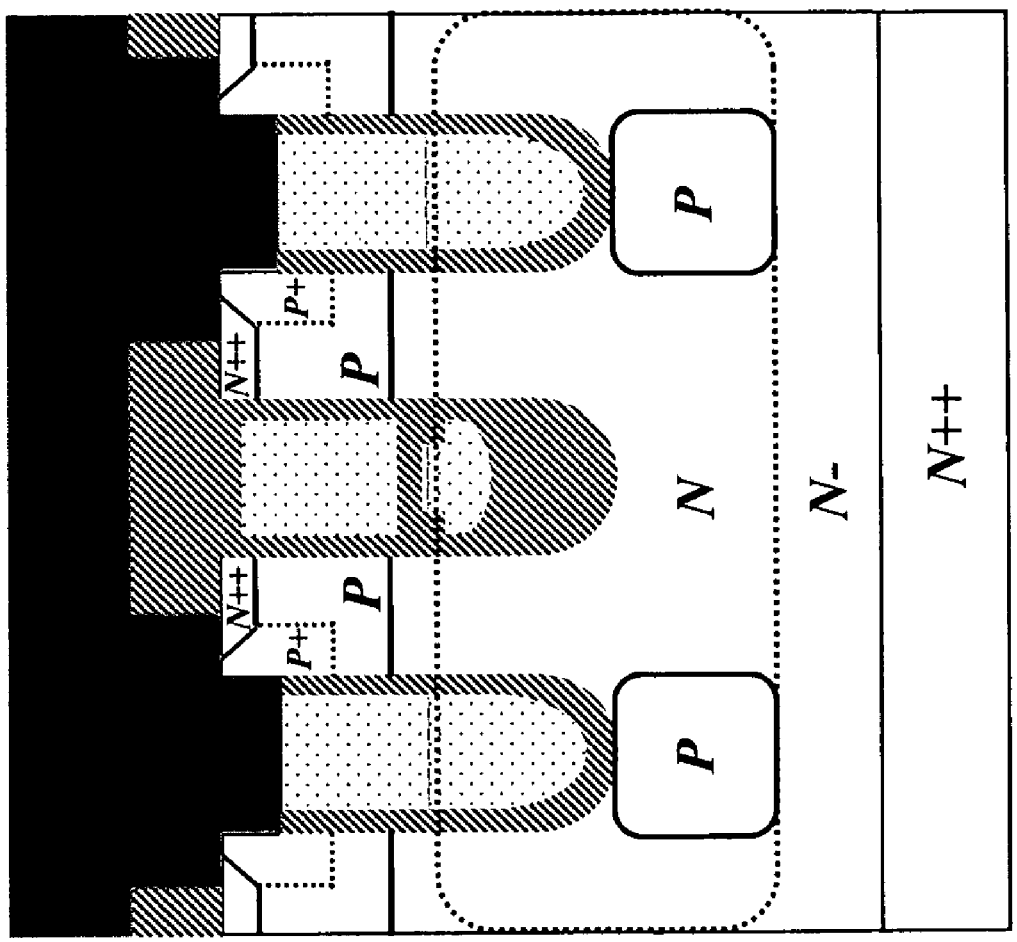
FIGS. 24A, 24B, 24C, 25A, 25B and 25C show cross-sectional views of RFP containing MOSFET structures with a Deep compensated zone (lightly doped p regions in 24B and 25B and lightly doped n regions in 24C and 25C), implemented in the split poly gated structure with a single poly layer structure in the RFP trench.
Figure 24C:
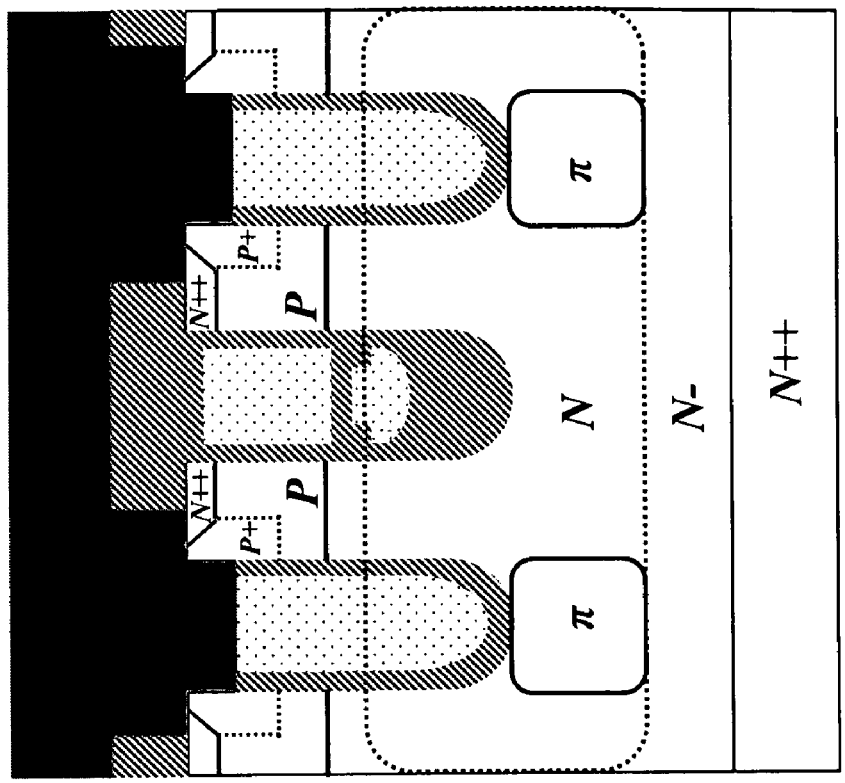
Figure 24B:
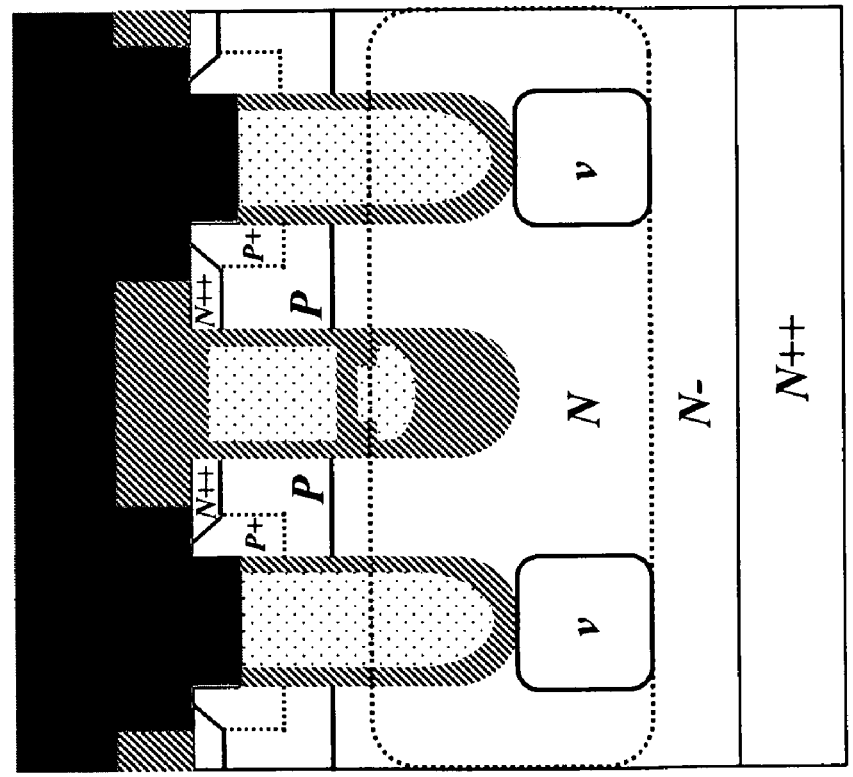
Figure 25A:
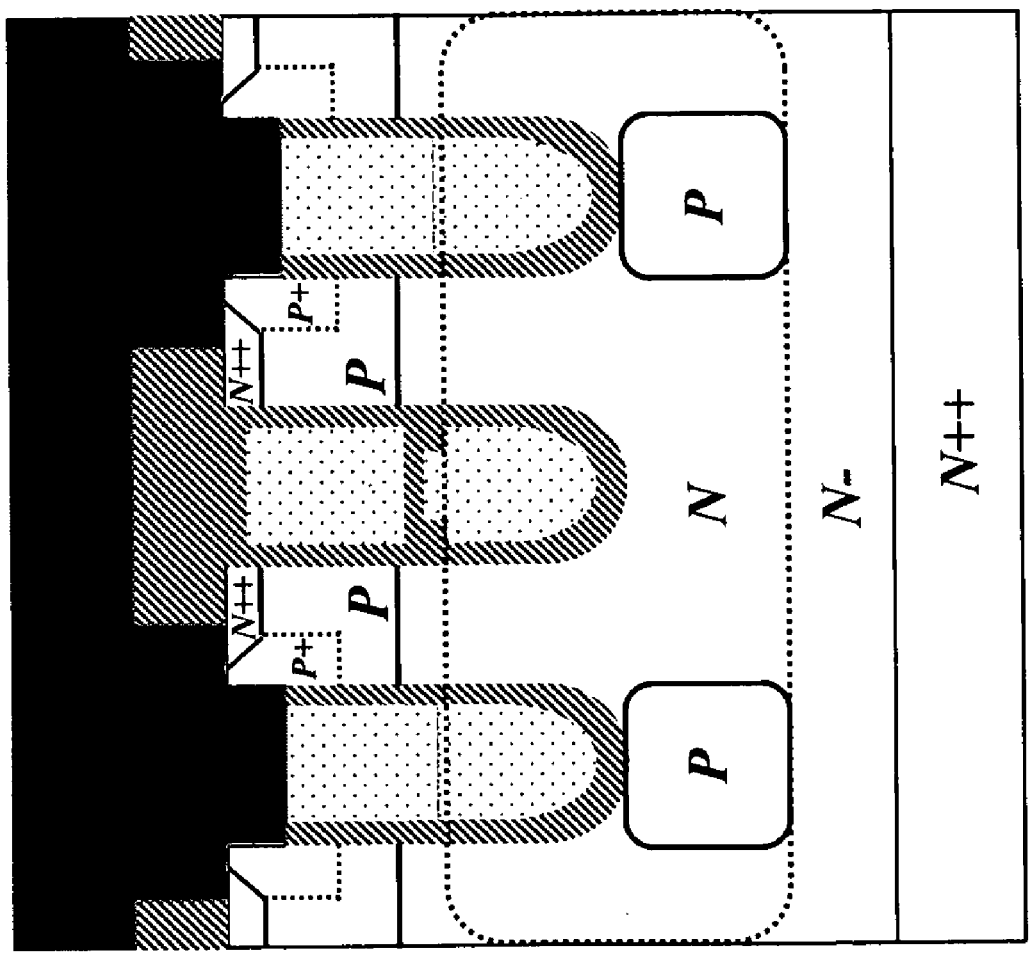
Figure 25C:
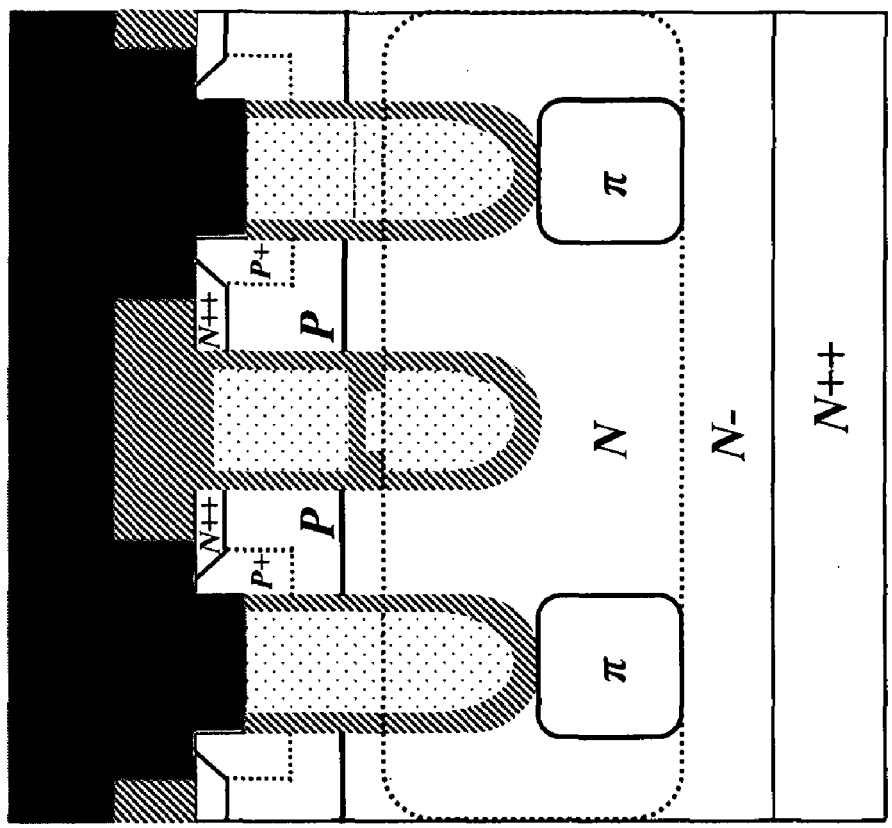
Figure 25B:
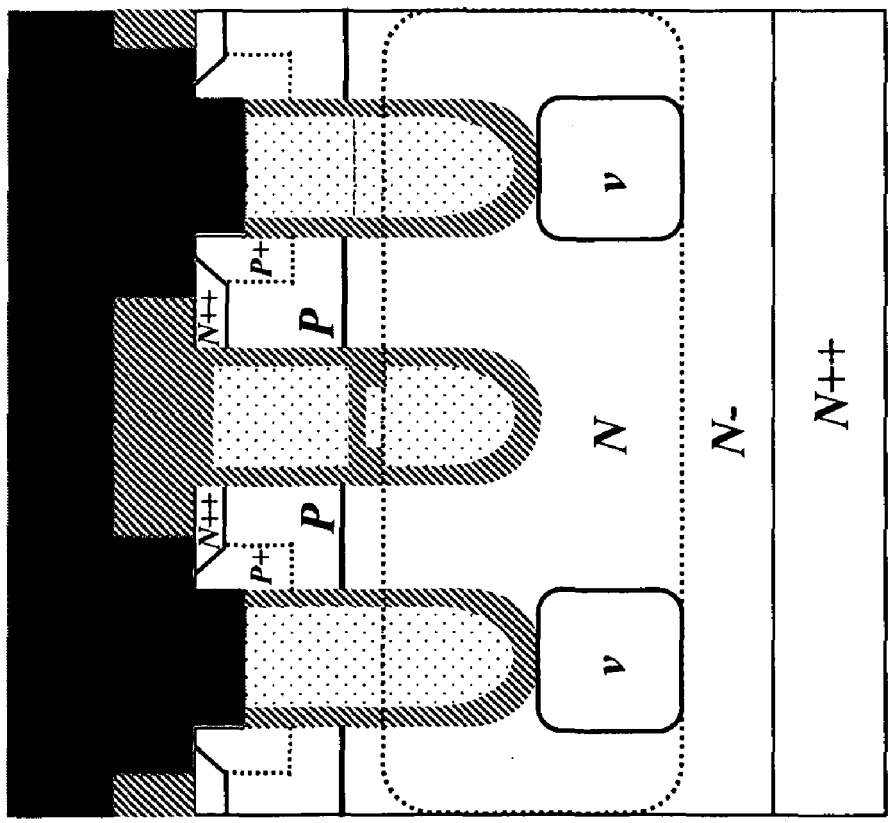

Furthermore, the techniques proposed in this invention may also be implemented using split poly gated device structures. One of implementation schemes are briefly demonstrated in the FIG. 21 to FIG. 23. The process includes deposition of a first poly layer in the trenches, poly etch-back, and oxide removal, gate oxidation, second poly layer deposition, and CMP and/or poly etch-back. The split gated double poly configuration shown in FIG. 21-23 is used to replace the single poly layer in the active trench gate and the RFP trench shown in FIG. 18. In this case, the bottom poly layer and the upper poly layer in RFP trench are both electrically shorted to the source metal. In addition, the split poly layers in the RFP region of device in FIG. 23 can be directly replaced by the single RFP poly layer as demonstrated by FIG. 24A and FIG. 25A. Depending on the doping concentration of P shield region (or isolation zone), at very light concentration, the P shield zone could be a "π" region (a very lightly doped P region) or a "ν" region (a very lightly doped n region) as shown in FIG. 24B, 24C, 25B and 25C.

Figure 28:
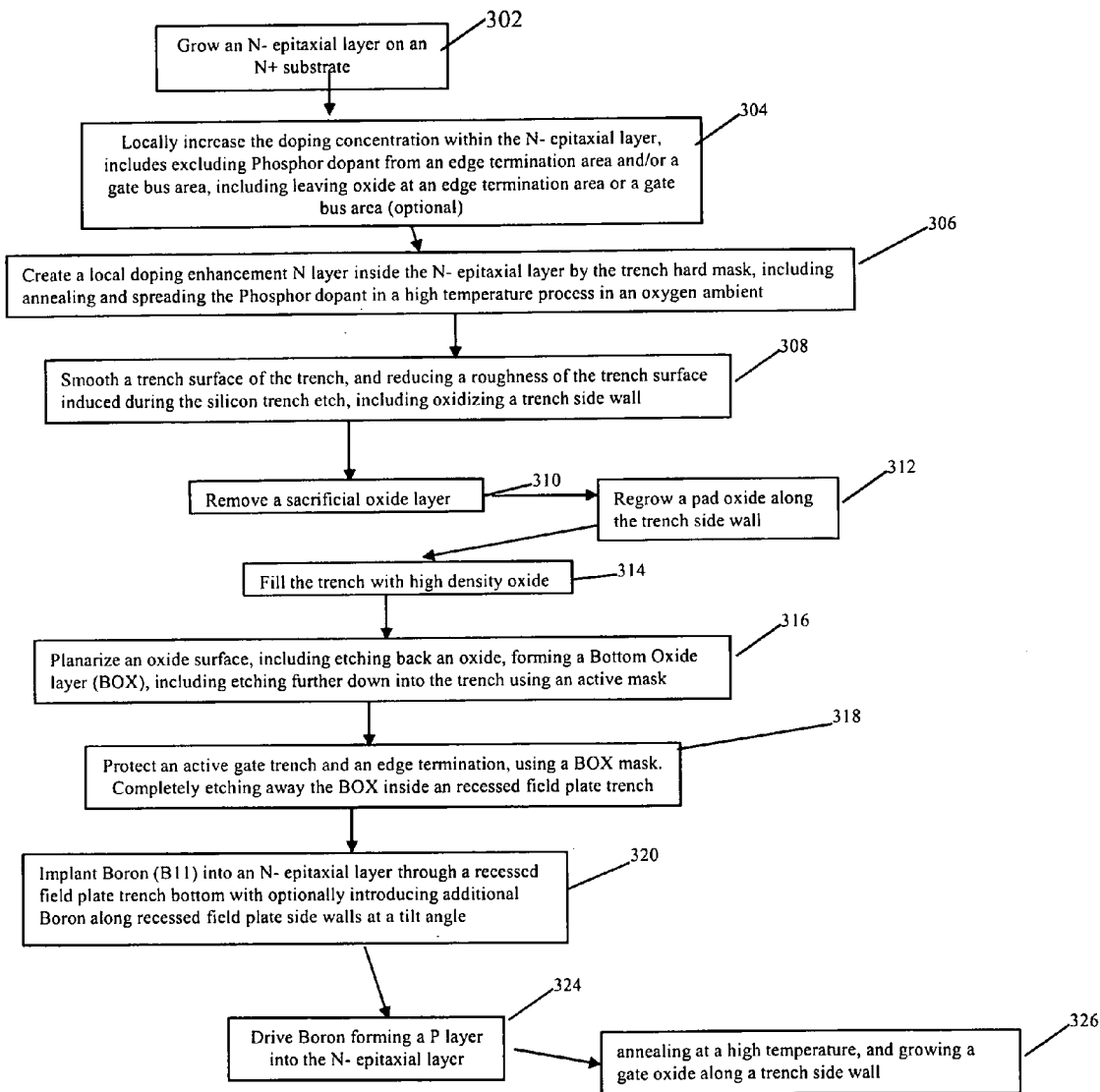
FIG. 28 shows a schematic flow chart for a sample fabrication process.

FIG. 28 is a flow chart depicting a fabrication process for making a MOSFET in accordance with one embodiment of the present invention. The fabrication process includes growing 302 an N-epitaxial layer on an N+ substrate. The fabrication process also includes locally increasing 304 the doping concentration within the N-epitaxial layer. Locally increasing 304 the doping concentration within the N-epitaxial layer includes blanket implanting phosphorous. The blanket implanting of phosphorous may be at a tilt angle of zero degrees, or may be at some other tilt angle. Locally increasing 304 the doping concentration within the N-epitaxial layer also includes excluding phosphorous dopant from an edge termination area and/or a gate bus area, including leaving oxide at an edge termination area or a gate bus area.

The fabrication process for making a MOSFET also includes creating 306 a doping enhancement N layer inside the N-epitaxial layer, including annealing and spreading the phosphorous dopant using a high temperature thermal process in an oxygen ambient. The fabrication process for making a MOSFET also includes smoothing 308 the trench surface of the trench, and reducing the roughness of the trench surface induced during the silicon trench etch, including oxidizing the trench side wall, removing 310 the sacrificial oxide layer, and regrowing 312 the pad oxide along the trench side wall.

The fabrication process for making a MOSFET also includes filling 314 the trench with high density oxide, planarizing oxide surface 316, including etching back an oxide, forming a Bottom Oxide layer (BOX), including etching further down into the trench using an active mask, and protecting 318 an active gate trench and an edge termination, using a BOX mask. The fabrication process for making a MOSFET also includes implanting 320 boron (B11) into an N-epitaxial layer through a recessed field plate trench bottom, including introducing boron along recessed field plate side walls at a tilt angle, completely etching away 322 the BOX inside an recessed field plate trench, including removing the oxide, optionally driving 324 boron forming a P layer into the N-epitaxial layer, including annealing at a high temperature, and growing 324 a gate oxide along a trench side wall.

For a sample 40V embodiment, preferred parameters are as follows. However, it must be understood that these parameters would be scaled for different operating voltages, and of course they can also be adapted for use with many other processes. In this sample embodiment, the trenches are 0.3 microns wide, about 1.0 micron deep, and are laid out on a one micron pitch. (The cell pitch is two microns, since there are two types of trench present.) In this sample embodiment, the starting material is 0.35 ohm-cm n-on-n+ epi, about 5.5 microns thick. A blanket n-enhancement implant is performed, e.g. with phosphorus at $3\,E12/cm^2$ (i.e. $3\times10^{12}\,cm^{-2}$). The trenches are then etched. After a sacrificial oxidation and trench fill (preferably using a deposited oxide plus oxidation), an etchback is preferably performed to clear the trenches to about half their depth. Photoresist is then patterned, to expose the RFP trenches but not the gate trenches, and the oxide plugs are removed from the RFP trenches. A P-type implant is then performed to form the P-isolation regions; in this example, a combination of two boron implants, one at 2.5 $E12/cm^2$ at 30 keV plus another 2 E12 at 120 keV. This will produce a counterdoped or compensated isolation region 114 below the RFP trenches, of about 0.7 micron depth. The remaining process steps then proceed conventionally, with formation of gate, body, source, contacts, etc.

As mentioned above, the locally enhanced n-doping which connects gate to drain, in various embodiments described above, reduces on-resistance. However, it is the improved off-state behavior provided by the added isolation regions which makes this enhanced n-doping possible.

In alternative embodiments, the depth of the isolation region can be e.g. from 0.25 micron to 2.5 micron, and scaled accordingly for operating voltages other than 40V. Similarly, the isolation implant, in alternative embodiments, can use a dose from $2\,E12\,cm^{-2}$ to 1 E13 at 20-320 keV, or even higher or lower doses and/or energies, plus allowance for scaling.

It will be appreciated that the foregoing is merely a description of some specific illustrative and exemplary embodiments of the present invention, and should not be considered as descriptive of the entire gamut of embodiments that fall within the scope of the present invention.

According to various embodiments, there is provided: a semiconductor device structure, comprising a gate which is positioned in a first trench, and capacitively coupled to control vertical conduction from a first-conductivity-type source through semiconductor material which is adjacent to said trench; recessed field plates, positioned in proximity to and capacitively coupled to said semiconductor material; said recessed field plates being positioned in respective second trenches; and diffusions of a second conductivity type lying at least partially beneath said respective second trenches.

According to various embodiments, there is provided: a semiconductor device structure, comprising a semiconductor layer; a gate which is positioned in a first trench within said semiconductor layer, and is capacitively coupled to control vertical conduction from a first-conductivity-type source through second-conductivity-type portions of said layer near said trench; recessed field plates, positioned in proximity to and capacitively coupled to said semiconductor material; said recessed field plates being positioned in respective second trenches; diffusion components of a second conductivity type lying at least partially beneath said respective second trenches; whereby said diffusion components reduce depletion of said second-conductivity-type portions of said layer in the OFF state.

According to various embodiments, there is provided: a semiconductor device structure, comprising a semiconductor layer; a gate which is positioned in a first trench within said semiconductor layer, and is capacitively coupled to control vertical conduction from a first-conductivity-type source through second-conductivity-type portions of said layer near said trench; recessed field plates, positioned in proximity to and capacitively coupled to said semiconductor material; said recessed field plates being positioned in respective second trenches; a first additional diffusion component of a second conductivity type lying at least partially beneath said respective second trenches; and a second additional diffusion component of said first conductivity type lying at least partially within said second-conductivity-type portions of said layer; whereby said first additional diffusion component reduces depletion of said second-conductivity-type portions of said layer in the OFF state; and whereby said second additional diffusion component reduces the on-resistance of the device in the ON state.

According to various embodiments, there is provided: an improved RFP transistor structure having (a) low total on-resistance, (b) reduced minority carrier injection efficiency (of body diode), (c) improved reverse recovery (of body diode), (d) lower reverse recovery charge, (d) soft recovery characteristic, (e) as reliable edge termination, without either reduction of breakdown voltage or degradation of the termination efficiency of device edge junction termination region, the improved structure comprising: an RFP transistor structure, including at least one or more gate trenches adjoined by one or more recessed-field-plate trenches; and respective deep compensated zones underneath said recessed-field-plate trenches.

According to various embodiments, there is provided: a method for operating a semiconductor device structure, comprising: controlling conduction between first and second source/drain electrodes through a channel location in semiconductor material using a gate electrode positioned in a first trench to provide at least ON and OFF states; and avoiding punchthrough of said channel location, using both one or more recessed field plates, positioned in proximity to and capacitively coupled to said semiconductor material; said recessed field plates being positioned in respective second trenches, and one or more diffusion components of a second conductivity type lying at least partially beneath said respective second trenches; whereby said diffusion components reduce depletion spreading in the OFF state.

According to various embodiments, there is provided: a fabrication process for making a MOSFET, comprising the actions, in any order, of: a) providing an n-type semiconductor layer; b) forming a p-type body in said layer; c) forming an n-type source, which is isolated by said body, in said layer; d) forming an insulated gate trench in said layer, and a gate electrode in said gate trench; said gate electrode being capacitively coupled to at least a portion of said body; e) forming a second insulated trench in said layer, providing an additional dose of acceptor dopants below said trench, and forming a Recessed Field Plate electrode in said second trench; and f) providing an additional dose of donor dopant atoms in said portion of said body, to thereby reduce the on-resistance.

According to various embodiments, there is provided: improved highly reliable power RFP structures and fabrication and operation processes. The structure includes plurality of localized dopant concentrated zones beneath the trenches of RFPs, either floating or extending and merging with the body layer of the MOSFET or connecting with the source layer through a region of vertical doped region. This local dopant zone decreases the minority carrier injection efficiency of the body diode of the device and alters the electric field distribution during the body diode reverse recovery.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The device may be fabricated in various layouts, including "stripe" and "cellular" layouts. The layers of source, body, and drain regions can be configured vertically, quasi-vertically as well as laterally. The epitaxial drift region can be either uniformly or non-uniformly doped. While the embodiments described above include an epitaxial layer grown on a substrate, the epitaxial layer may be omitted in some applications. Various features of different embodiments may be combined and recombined for various applications.

For example, the region between channel and drain does not have to be uniformly doped, neither vertically nor laterally. The improvements in drift or spreading region doping provided by the disclosed inventions can be combined with a wide variety of other device improvements and features.

For another example, the RFP and gate trenches do not necessarily have to have the same width.

The design could be applied to IGBTs or other devices which include bipolar conduction. The bottom of the gate trench can be modified with dopant; the design can also vary at the source structure and at the drain structure; and alternative body structure may be used; contact trench may be produced first, then cut gate trench, and construct the source and drain structure.

Of course, the n-type dopant, in silicon, can be phosphorus, antimony, or arsenic, or combinations of these. Appropriate donor dopants can be used in other semiconductor materials.

As the disclosed process is scaled to other operating voltages, it is expected that predictable scaling of dimensions and dopants may allow the same synergy. For example, in a 200V embodiment, the inventors contemplate that the trench depth would be slightly deeper (e.g. 1.5 to 2.5 micron), and the compensation implant energy and dose would be about the same. Of course the epi layer doping would be substantially less, and the epi layer thickness greater, as is well understood by those of ordinary skill. The n-enhancement doping (which is preferably blocked from the termination) can have a distribution, after drive-in, which reaches to the upper boundary of the compensation implant, but preferably not to the lower boundary of the compensation implant.

The following applications may contain additional information and alternative modifications: Ser. No. 61/125,892 filed Apr. 29, 2008; Ser. No. 61/058,069 filed Jun. 2, 2008 and entitled "Edge Termination for Devices Containing Permanent Charge"; Ser. No. 61/060,488 filed Jun. 11, 2008 and entitled "MOSFET Switch"; Ser. No. 61/074,162 filed Jun. 20, 2008 and entitled "MOSFET Switch"; Ser. No. 61/076,767 filed Jun. 30, 2008 and entitled "Trench-Gate Power Device"; Ser. No. 61/080,702 filed Jul. 15, 2008 and entitled "A MOSFET Switch"; Ser. No. 61/084,639 filed Jul. 30, 2008 and entitled "Lateral Devices Containing Permanent Charge"; Ser. No. 61/084,642 filed Jul. 30, 2008 and entitled "Silicon on Insulator Devices Containing Permanent Charge"; Ser. No. 61/027,699 filed Feb. 11, 2008 and entitled "Use of Permanent Charge in Trench Sidewalls to Fabricate Un-Gated Current Sources, Gate Current Sources, and Schottky Diodes"; Ser. No. 61/028,790 filed Feb. 14, 2008 and entitled "Trench MOSFET Structure and Fabrication Technique that Uses Implantation Through the Trench Sidewall to Form the Active Body Region and the Source Region"; Ser. No. 61/028,783 filed Feb. 14, 2008 and entitled "Techniques for Introducing and Adjusting the Dopant Distribution in a Trench MOSFET to Obtain Improved Device Characteristics"; Ser. No. 61/091,442 filed Aug. 25, 2008 and entitled "Devices Containing Permanent Charge"; Ser. No. 61/118,664 filed Dec. 1, 2008 and entitled "An Improved Power MOSFET and Its Edge Termination"; and Ser. No. 61/122,794 filed Dec. 16, 2008 and entitled "A Power MOSFET Transistor".

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device structure, comprising:
   a semiconductor layer;
   a gate which is positioned in a first trench within said semiconductor layer, and is capacitively coupled to control vertical conduction from a first-conductivity-type source through second-conductivity-type portions of said layer near said trench;
   recessed field plates, positioned in proximity to and capacitively coupled to said semiconductor material; said recessed field plates being positioned in respective second trenches;
   a first additional diffusion component of a second conductivity type lying at least partially beneath said respective second trenches; and
   a second additional diffusion component of said first conductivity type lying at least partially within said second-conductivity-type portions of said layer;
   whereby said first additional diffusion component reduces depletion of said second-conductivity-type portions of said layer in the OFF state;
   and whereby said second additional diffusion component reduces the on-resistance of the device in the ON state.

2. The semiconductor device structure of claim 1, wherein said gate has a split poly configuration.

3. The semiconductor device structure of claim 1, wherein at least one of said recessed field plates has a split poly configuration.

4. The semiconductor device structure of claim 1, wherein both the gate and at least one of the recessed field plates have a split poly configuration.

5. The semiconductor device structure of claim 1, wherein said diffusion components have a concentration sufficiently high to locally counterdope said semiconductor layer and thereby produce a second conductivity-type region below said second trench.

6. The semiconductor device structure of claim 1, wherein said semiconductor layer is an epitaxial layer.

* * * * *